(12) United States Patent
Inoue et al.

(10) Patent No.: US 10,741,690 B2
(45) Date of Patent: Aug. 11, 2020

(54) THIN FILM TRANSISTOR, THIN FILM TRANSISTOR SUBSTRATE, AND LIQUID CRYSTAL DISPLAY DEVICE

(71) Applicant: Mitsubishi Electric Corporation, Chiyoda-ku (JP)

(72) Inventors: Kazunori Inoue, Kumamoto (JP); Rii Hirano, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/465,227

(22) PCT Filed: Sep. 26, 2017

(86) PCT No.: PCT/JP2017/034634
§ 371 (c)(1),
(2) Date: May 30, 2019

(87) PCT Pub. No.: WO2018/150620
PCT Pub. Date: Aug. 23, 2018

(65) Prior Publication Data
US 2020/0012132 A1    Jan. 9, 2020

(30) Foreign Application Priority Data
Feb. 16, 2017 (JP) .................. 2017-026651

(51) Int. Cl.
*H01L 29/786* (2006.01)
*G02F 1/1362* (2006.01)
(Continued)

(52) U.S. Cl.
CPC .... *H01L 29/78606* (2013.01); *H01L 27/1225* (2013.01); *H01L 27/1259* (2013.01); *H01L 29/41733* (2013.01); *H01L 29/7869* (2013.01)

(58) Field of Classification Search
CPC ............. H01L 27/1225; H01L 27/1259; H01L 29/41733; H01L 29/78606; H01L 27/1251; G02F 1/136286
See application file for complete search history.

(56) References Cited

U.S. PATENT DOCUMENTS 6,016,174 A    1/2000 Endo et al.
6,449,026 B1   9/2002 Min et al.
(Continued)

FOREIGN PATENT DOCUMENTS

JP    62-235784 A    10/1987
JP    10-268353 A    10/1998
(Continued)

OTHER PUBLICATIONS

International Search Report dated Dec. 19, 2017 in PCT/JP2017/034634 filed on Sep. 26, 2017.
(Continued)

*Primary Examiner* — Changhyun Yi
(74) *Attorney, Agent, or Firm* — Xsensus LLP

(57) ABSTRACT

It is an object of the present invention to provide a technique capable of reducing a contact resistance between source and drain electrodes and a channel region. A thin film transistor includes: a first semiconductor layer provided on a first insulation film lying on a gate electrode and adjacent to a partial region that is part of the first insulation film lying on the gate electrode as seen in plan view; a source electrode and a drain electrode sandwiching the partial region therebetween as seen in plan view; a second insulation film having an opening portion provided over the partial region; and a second semiconductor layer provided on the second insulation film. The second semiconductor layer is in contact with the source electrode and the drain electrode, and is in contact with the partial region and the first semiconductor (Continued)

layer through the opening portion of the second insulation film.

18 Claims, 21 Drawing Sheets

(51) Int. Cl.
  *G02F 1/1368* (2006.01)
  *H01L 27/12* (2006.01)
  *H01L 29/417* (2006.01)

(56) References Cited

U.S. PATENT DOCUMENTS

| | | | |
|---|---|---|---|
| 9,054,203 B2* | 6/2015 | Miyairi | H01L 27/1225 |
| 9,076,875 B2 | 7/2015 | Inoue et al. | |
| 2003/0075715 A1 | 4/2003 | Satoh et al. | |
| 2007/0090365 A1 | 4/2007 | Hayashi et al. | |
| 2007/0236640 A1 | 10/2007 | Kimura | |
| 2010/0065838 A1 | 3/2010 | Yamazaki et al. | |
| 2010/0065839 A1 | 3/2010 | Yamazaki et al. | |
| 2010/0163865 A1* | 7/2010 | Arai | H01L 27/124 257/43 |
| 2014/0306219 A1 | 10/2014 | Yamazaki et al. | |
| 2015/0153599 A1 | 6/2015 | Yamazaki et al. | |
| 2018/0211984 A1* | 7/2018 | Zeng | H01L 29/78636 |

FOREIGN PATENT DOCUMENTS

| | | |
|---|---|---|
| JP | 2001-56474 A | 2/2001 |
| JP | 2003-92410 A | 3/2003 |
| JP | 2004-103957 A | 4/2004 |
| JP | 2005-77822 A | 3/2005 |
| JP | 2007-115902 A | 5/2007 |
| JP | 2010-93238 A | 4/2010 |
| JP | 2014-44428 A | 3/2014 |
| JP | 2014-116617 A | 6/2014 |
| JP | 2014-220492 A | 11/2014 |
| JP | 2014-222342 A | 11/2014 |
| JP | 2015-130487 A | 7/2015 |

OTHER PUBLICATIONS

Nomura, K. et al., "Room-temperature fabrication of transparent flexible thin-film transistors using amorphous oxide semiconductors," NATURE, vol. 432, Nov. 2004, pp. 488-492.

Ha, S. H. et al., "Channel Length Dependent Bias-Stability of Self-Aligned Coplanar a-IGZO TFTs," Journal of Display Technology, vol. 9, No. 12, Dec. 2013, pp. 985-988.

Chuang, C.-S. et al., "Photosensitivity of Amorphous IGZO TFTs for Active-Matrix Flat-Panel Displays," SID 08 DIGEST, 2008, pp. 1215-1218.

* cited by examiner

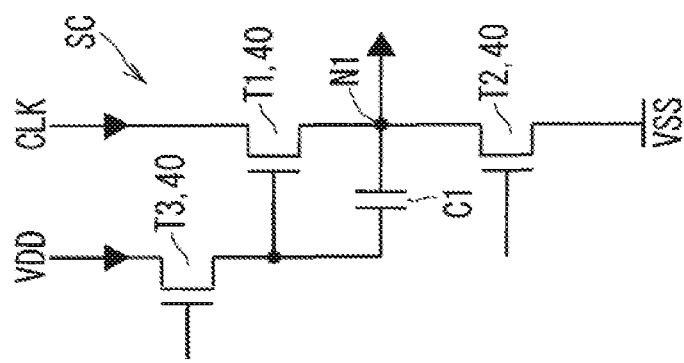
F I G. 1B
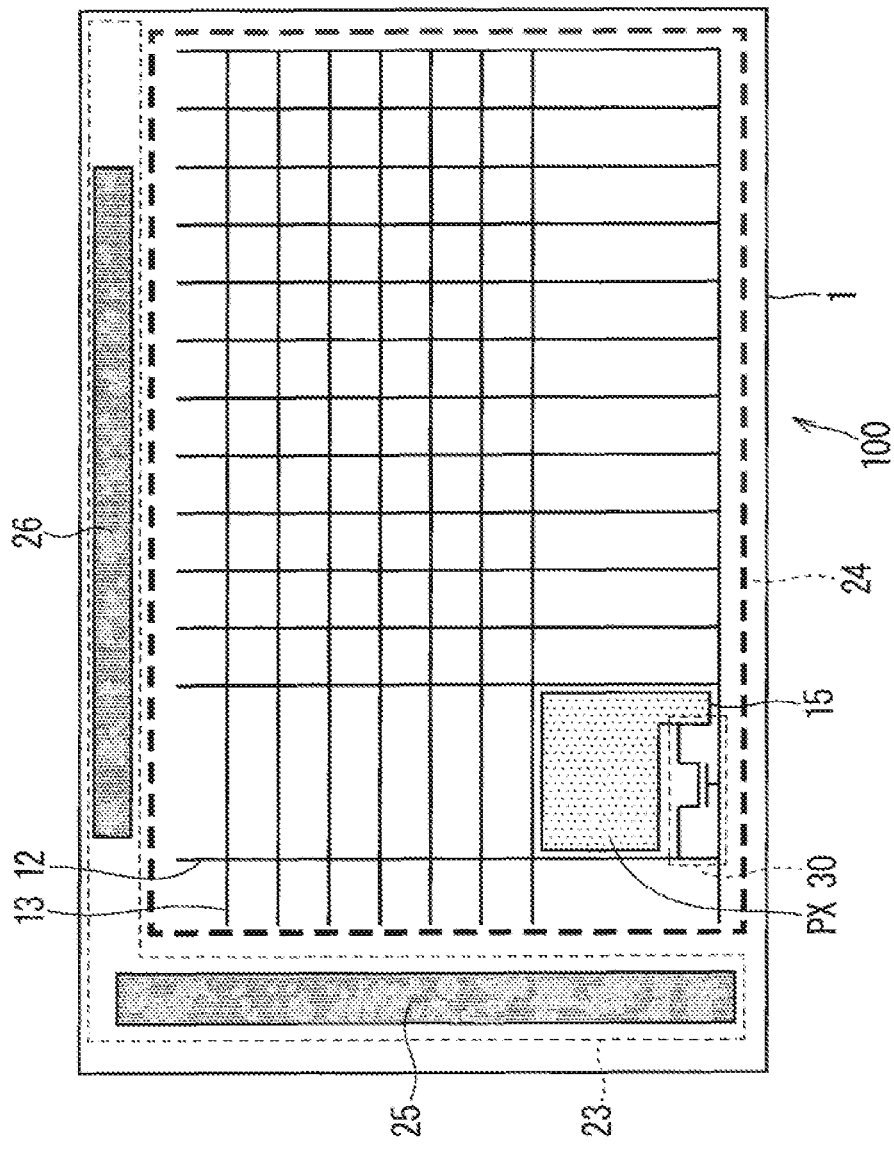
F I G. 1A

THIN FILM TRANSISTOR, THIN FILM TRANSISTOR SUBSTRATE, AND LIQUID CRYSTAL DISPLAY DEVICE

TECHNICAL FIELD

The present invention relates to a thin film transistor, a thin film transistor substrate and a liquid crystal display device which include the same.

BACKGROUND ART

A liquid crystal display (LCD) which is one typical thin panel has been widely used for a personal computer, a monitor for a personal digital assistant, and the like by utilizing its advantages of being low in power consumption, small in size, and light in weight. In recent years, the liquid crystal display has been widely used for a TV monitor and the like.

In particular, an active matrix substrate (referred to hereinafter as a "TFT substrate") including thin film transistors (TFTs) used as switching elements is well known as a substrate for use in an electro-optic device such as a LCD. A LCD (referred to hereinafter as a TFT-LCD) employing a TFT substrate has been required to achieve not only improvements in display performance such as a wider viewing angle, higher definition, and higher quality but also reductions in costs resulting from simplified manufacturing steps and efficient manufacture.

A typical TFT-LCD includes a TFT substrate which is an element substrate including a plurality of pixels disposed in a matrix and each including a pixel electrode and a TFT connected thereto, and a CF substrate which is a counter substrate including a counter electrode opposed to the pixel electrodes, a color filter (CF), and the like. A liquid crystal cell configured such that a liquid crystal layer is held between these substrates is used as a basic structure. Polarizers and the like are mounted to the liquid crystal cell. A full transmission type LCD, for example, includes a backlight (BL) provided on the back surface side of the liquid crystal cell.

An example of the liquid crystal cell in which the pixel electrodes for generating an electric field for driving liquid crystal and the counter electrode are disposed so as to hold the liquid crystal layer therebetween in this manner includes a vertical electric field driving mode liquid crystal cell typified by a TN (Twisted Nematic) mode. In general, TN mode TFT substrates are often manufactured by undergoing five photolithographic steps (photolithographic processes), as disclosed in Patent Document 1 to be described below which illustrates a manufacturing method, for example. These structures are based on TFTs (BCE type TFTs) employing a back channel etching (BCE) structure as a basis.

On the other hand, an IPS (registered trademark) (In Plane Switching) mode which is a horizontal electric field driving mode in which both the pixel electrodes and the counter electrode are disposed on the TFT substrate has been proposed from the viewpoint of widening the viewing angle of the TFT-LCD. The IPS mode provides a wider viewing angle than the vertical electric field driving mode, but finds difficulties in providing bright display properties because of the problem that an image display portion in the IPS mode has a lower aperture ratio and a lower transmittance than that in the vertical electric field driving mode. This problem results from the fact that an electric field for driving liquid crystal does not effectively act on the liquid crystal lying in an area immediately over comb tooth shaped pixel electrodes. As a horizontal electric field driving mode capable of mending this problem, a fringe field switching (FFS) mode as disclosed in Patent Document 2, for example, has been proposed.

In the FFS mode, the counter electrode and the pixel electrodes are disposed on the TFT substrate, with an interlayer insulation film therebetween. One of the counter electrode and each pixel electrode which is provided as an upper layer has liquid crystal controlling slits (or a comb tooth shape) formed therein and serves as a slit electrode (or a comb tooth electrode). Such a FFS mode enables a horizontal electric field to be applied to liquid crystal molecules lying immediately over a pixel portion by generating an oblique electric field (fringe field), thereby sufficiently driving the liquid crystal molecules. This provides a wide viewing angle and a higher transmittance than in the IPS mode. In this FFS mode configuration, a reduction in pixel aperture ratio is prevented by forming the pixel electrodes, the counter electrode, and the liquid crystal controlling slit electrode made of a transparent conductive film. Unlike the TN mode LCDs, it is not always necessary for the FFS mode LCDs to separately provide a storage capacitor pattern in pixels because a pixel electrode and the counter electrode form a storage capacitor. From these viewpoints, the FFS mode configuration achieves a liquid crystal display having a high pixel aperture ratio.

In general, amorphous silicon (a-Si) has been used for a semiconductor channel layer in switching elements of TFT substrates for conventional LCDs. A principal reason therefor is that a film having uniform properties is formed on a substrate having a large area because of its amorphousness. Another principal reason is that an amorphous silicon film, which can be deposited at a relatively low temperature, can be manufactured on a less heat-resistant and less expensive glass substrate to consequently have good compatibility with displays for liquid crystal display devices for typical TVs.

In recent years, TFTs (oxide semiconductor TFTs) in which an oxide semiconductor is used for a channel layer have been frequently developed (for example, Patent Documents 3 and 4, and Non-Patent Document 1). Examples of the oxide semiconductor include zinc oxide (ZnO) based semiconductors and InGaZnO based semiconductors prepared by adding gallium oxide ($Ga_2O_3$) and indium oxide ($In_2O_3$) to zinc oxide (ZnO). These oxide semiconductor films have higher permeability to light than Si semiconductor films. For example, an oxide semiconductor film having a permeability of not less than 70% to visible light in the range of 400 to 800 nm is disclosed in Patent Document 5.

The oxide semiconductor is advantageous not only in providing an amorphous film having good uniformity with stability by making the composition thereof proper but also in achieving small-sized high-performance TFTs because of its higher mobility than conventional a-Si. This is advantageous in that a TFT substrate having a high pixel aperture ratio is provided by applying such an oxide semiconductor film to the TFTs of pixels. Thus, the use of oxide semiconductor TFTs for a FFS mode TFT substrate achieves LCDs having both a wider viewing angle and brighter display properties.

Further, it has been necessary that circuits having a relatively large area as driving circuits for applying a driving voltage to pixel TFTs are mounted to the TFT substrate because a-Si is relatively low in mobility. However, the driving circuits employing oxide semiconductor TFTs having high mobility are achieved by circuits having a relatively small area, so that the driving circuits can be produced on the same substrate as the pixel TFTs. This is advantageous in eliminating the need to individually mount the driving circuits to thereby produce a LCD at low costs, and in providing a narrower frame region for a LCD which has been required in space for mounting the driving circuits.

However, the oxide semiconductor is in general poor in chemical resistance to have the property of easily dissolving in a weakly acid chemical liquid such as oxalic acid (carboxylic acid). Thus, if the oxide semiconductor is used for TFTs having a BCE structure which go mainstream for a-Si and source and drain electrodes immediately over a channel layer are formed by wet etching using an acid chemical liquid, there arises a problem that the oxide semiconductor for the channel layer is also etched. As a result, there has been a problem that a Channel region with high reliability cannot be formed.

To solve this problem, a TFT having an etch stopper (ES) structure in which a protective insulation film is formed on a channel region of an oxide semiconductor, for example, as disclosed in Patent Document 6 and a TFT having an inverted coplanar structure disclosed in Patent Documents 7, 8, and 9, and the like have been proposed. In the ES structure, the protective insulation film prevents the channel region from being exposed to a chemical liquid during the process of wet etching of the source and drain electrodes. In the inverted coplanar structure, the channel region is prevented from being exposed to a chemical liquid because an oxide semiconductor having a channel region is formed after the formation of the source and drain electrodes. Thus, oxide semiconductor TFTs with high reliability are produced. It should be noted that the inverted coplanar structure disclosed in Patent Documents 7, 8, and 9 is used as a structure for preventing process damages also in organic semiconductor TFTs in which organic compounds are used for a semiconductor channel layer (for example, Patent Document 10).

PRIOR ART DOCUMENTS

Patent Documents

Patent Document 1: Japanese Patent Application Laid-Open No. 10-268353 (1998)
Patent Document 2: Japanese Patent Application Laid-Open No. 2001-56474
Patent Document 3: Japanese Patent Application Laid-Open No. 2004-103957
Patent Document 4: Japanese Patent Application Laid-Open No. 2005-77822
Patent Document 5: Japanese Patent Application Laid-Open No. 2007-115902
Patent Document 6: Japanese Patent Application Laid-Open No. 62-235784 (1987)
Patent Document 7: Japanese Patent Application Laid-Open No. 2010-93238
Patent Document 8: Japanese Patent Application Laid-Open No. 2014-116617
Patent Document 9: Japanese Patent Application Laid-Open No. 2014-222342
Patent Document 10: Japanese Patent Application Laid-Open No. 2003-92410

Non-Patent Documents

Non-Patent Document 1: Kenji Nomura, et al, "Room-temperature fabrication of transparent flexible thin-film transistors using amorphous oxide semiconductors", Nature, 2004, vol. 432, pp. 488-492

SUMMARY

Problem to be Solved by the Invention

The FFS mode LCDs, which are good in viewing angle properties and in panel permeability as mentioned above, are in increasing demand. However, it is necessary that both the pixel electrodes and the counter electrode (common electrode) are formed on a TFT substrate for use in the FFS mode LCDs. As a result, there arises a problem that the number of layers of electrodes and interconnect lines in the TFT substrate increases and the number of photolithographic steps required for the formation of the TFT substrate accordingly increases, which in turn gives rise to an increase in manufacturing costs.

For example, a TFT substrate for a FFS-LCD having a typical BCE type structure (to which a BCE type TFT is applied) disclosed in FIGS. 1 and 3 of Patent Document 2 requires six photolithographic steps for (1) a counter electrode (common electrode), (2) a gate electrode, (3) a semiconductor layer, (4) a source electrode and a drain electrode, (5) a contact hole in an insulation layer, and (6) a pixel electrode (slit electrode). This presents a problem that manufacturing costs are increased as compared with a TFT substrate having a BCE type structure of a conventional TN mode which is manufacturable by undergoing typically five photolithographic steps.

Also, when an oxide semiconductor is applied to the aforementioned TFT substrate for the FFS-LCD, it is difficult to use the BCE type structure for the manufacture of the oxide semiconductor poor in chemical resistance, so the ES structure is required for the oxide semiconductor. However, a new photolithographic step for the formation of a protective insulation film is added before the formation of the source and drain electrodes in the ES structure disclosed in Patent Document 6. This presents a problem that manufacturing costs are further increased. Another problem arises in that a wider overlap region between the semiconductor layer and the source and drain electrodes increases the size and parasitic capacitance of the TFT.

On the other hand, the inverted coplanar structure disclosed in Patent Documents 7 to 10 is manufactured by interchanging the step for the semiconductor layer and the step for the source and drain electrodes. It is hence unnecessary to add a new photolithographic step which has been required for the ES structure.

Unlike organic semiconductors formed typically by a solution dropping method and a coating method, an oxide semiconductor film formed by a sputtering method has a problem to be described below in some cases. During the deposition of the oxide semiconductor film, metal atoms constituting the source and drain electrodes are diffused into the oxide semiconductor film to degrade the properties of a semiconductor channel region, thereby resulting in degradation of TFT properties.

In the inverted coplanar structure, an electric field from the gate electrode for driving a TFT is blocked by the source and drain electrodes and is less prone to be applied to the semiconductor channel region formed on the source and drain electrodes. Thus, the inverted coplanar structure has a problem that an increase in contact resistance between the source and drain electrodes and the semiconductor channel layer reduces an on-state current and mobility.

In view of the foregoing, it is therefore an object of the present invention to provide a technique capable of reducing a contact resistance between source and drain electrodes and a channel region.

Means to Solve the Problem

A thin film transistor according to the present invention comprises: a gate electrode provided on a substrate; a first insulation film for covering the gate electrode; a first semiconductor layer provided on the first insulation film lying on the gate electrode and adjacent to a partial region that is part of the first insulation film lying on the gate electrode as seen in plan view; a source electrode and a drain electrode sandwiching the partial region between the source electrode and the drain electrode as seen in plan view, at least one of the source and drain electrodes being provided on the first insulation film and the first semiconductor layer; a second insulation film provided on the source electrode and the drain electrode except part of the source electrode and part of the drain electrode and having an opening portion provided over the partial region; and a second semiconductor layer provided on the second insulation film, the second semiconductor layer being in contact with the part of the source electrode and the part of the drain electrode, the second semiconductor layer being in contact with the partial region and the first semiconductor layer through the opening portion.

Effects of the Invention

According to the present invention, the second semiconductor layer is provided on the second insulation film. The second semiconductor layer is in contact with the part of the source electrode and the part of the drain electrode, and is in contact with the partial region and the first semiconductor layer through the opening portion of the second insulation film. Such a configuration reduces a contact resistance between the source and drain electrodes and a channel region.

These and other objects, features, aspects and advantages of the present invention will become more apparent from the following detailed description of the present invention when taken in conjunction with the accompanying drawings.

BRIEF DESCRIPTION OF DRAWINGS

FIGS. 1A and 1B are plan views schematically showing an overall configuration of a TFT substrate according to a first embodiment.

DESCRIPTION OF EMBODIMENT(S)

Figure 2:
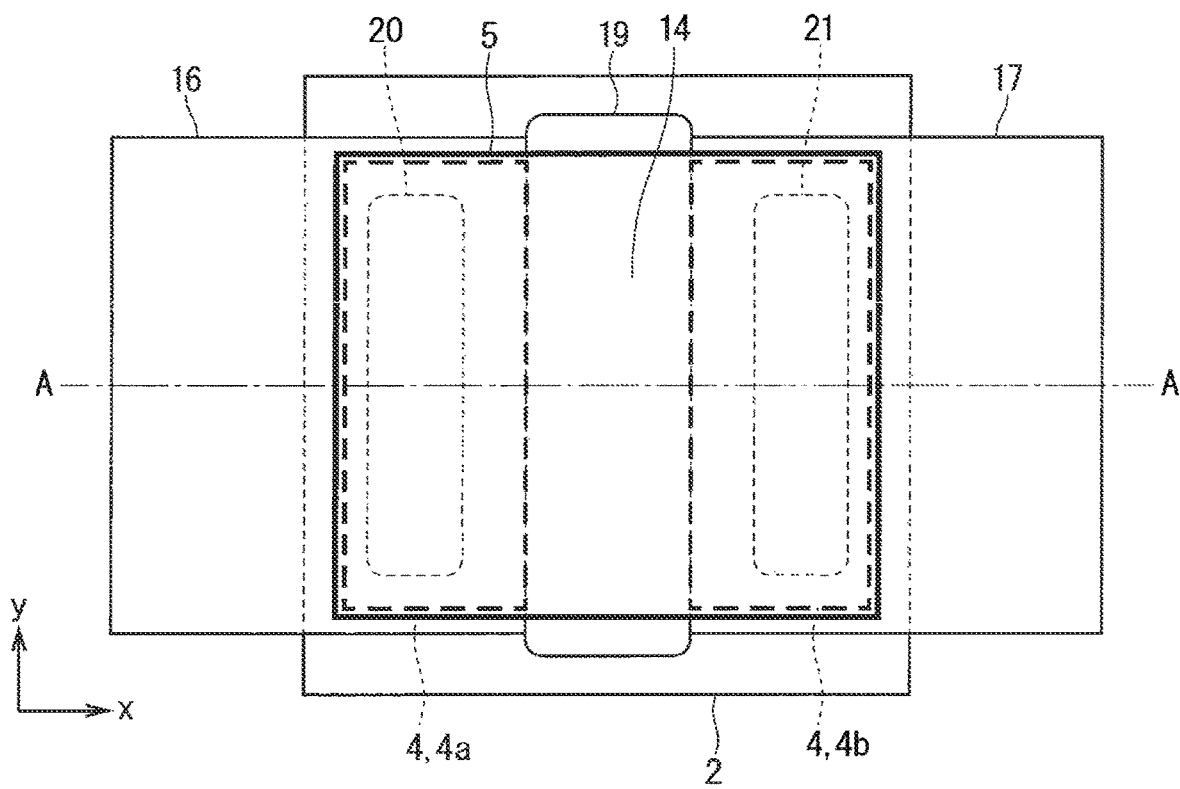
FIG. 2 is a plan view showing a planar structure of a TFT according to the first embodiment.

Embodiments according to the present invention will now be described in detail with reference to the drawings. A TFT according to the embodiments of the present invention is used as a switching device such as a switching element, and is applicable to at least one of a pixel and a driving circuit in a TFT substrate for a liquid crystal display device (LCD) and the like.

FIRST EMBODIMENT

FIG. 1 is a FIGS. 1A and 1B are plan vices views schematically illustrating an overall configuration of a TFT substrate 100 according to a first embodiment of the present invention. As shown in FIG. 1A, the TFT substrate 100 is roughly divided into a display region 24 in which pixels including pixel TFTs 30 are arranged in a matrix and a frame region 23 adjacent to the display region 24 so as to surround the display region 24.

In the display region 24, a plurality of gate interconnect lines 13 and a plurality of source interconnect lines 12 intersecting each other at right angles are disposed on a substrate 1, and pixel regions PX each including a pixel TFT 30 and a pixel electrode 15 are provided in corresponding relation to the respective intersecting portions of the source interconnect lines 12 and the gate interconnect lines 13. The source interconnect lines 12 and the gate interconnect lines 13 are electrically connected to the pixel TFTs 30 corresponding thereto. The pixel electrodes 15 are in contact with and electrically connected to drain electrodes of the respective pixel TFTs 30. Each of the pixel regions PX is a region surrounded by at least two of the source interconnect lines 12 and at least two of the gate interconnect lines 13, and is a region defined by the source interconnect lines 12 and the gate interconnect lines 13.

In the frame region 23 are provided a scanning signal driving circuit 25 for providing a driving voltage to the gate interconnect lines 13 and a display signal driving circuit 26 for providing a driving voltage to the source interconnect lines 12. When the scanning signal driving circuit 25 causes current to flow selectively to one of the gate interconnect lines 13 and the display signal driving circuit 26 causes current to flow selectively to one of the source interconnect lines 12, a pixel TFT 30 of a pixel present at an intersection point of the one gate interconnect line 13 and the one source interconnect line 12 turns on, so that electrical charge is stored in a pixel electrode electrically connected to the pixel TFT 30.

The use of oxide semiconductors as a constituent material of a channel layer for the pixel TFTs 30 achieves the size reduction of the pixel TFTs 30 because the oxide semiconductors are high in mobility. Similarly, the use of oxide semiconductors as a constituent material of a channel layer for driving TFTs 40 included in the scanning signal driving circuit 25 and the display signal driving circuit 26 achieves the size reduction of the driving TFTs 40 and accordingly the size reduction of the scanning signal driving circuit 25 and the display signal driving circuit 26. As a result, this allows the frame region 23 of the TFT substrate 100 to accommodate the scanning signal driving circuit 25 and the display signal driving circuit 26, thereby achieving reductions in costs of the scanning signal driving circuit 25 and the display signal driving circuit 26 and in width of the frame region 23.

FIG. 1B is a diagram showing a configuration in a region of interest of the scanning signal driving circuit 25 of FIG. 1A. As shown in FIG. 1B, the scanning signal driving circuit 25 includes a plurality of driving voltage generating circuits SC each having NMOS transistors T1, T2, and T3. Likewise, the display signal driving circuit 26 includes a plurality of driving voltage generating circuits SC (not shown). The current flowing through the driving TFTs 40 shall flow from a drain electrode to a source electrode.

A driving voltage generating circuit SC includes the NMOS transistors T1 to T3 each of which is a driving TFT 40. The NMOS transistor T1 has a drain electrode to which a clock signal CLK is provided. The NMOS transistor T2 has a source electrode to which a ground potential VSS is provided and a drain electrode connected to a source electrode of the NMOS transistor T1. The NMOS transistor T3 has a drain electrode to which a power supply potential VDD is provided and a source electrode connected to a gate electrode of the NMOS transistor T1.

The source electrode of the NMOS transistor T3 is connected through a capacitor C1 to a connection node N1 between the NMOS transistors T1 and T2. The connection node N1 between the NMOS transistors T1 and T2 is used as an output node for the driving voltage generating circuit SC, whereby the driving voltage generating circuit SC is able to provide a driving voltage from the connection node N1 to a corresponding one of the gate interconnect lines 13 or the source interconnect lines 12.

When an ON signal is provided to a gate electrode of the NMOS transistor T3, the NMOS transistor T3 turns on. Accordingly, the NMOS transistor T1 turns on, so that the clock signal CLK is outputted from the connection node N1. When an ON signal is provided to the NMOS transistor T2, the NMOS transistor T2 turns on. Accordingly, the potential at the connection node N1 is fixed at the ground potential VSS.

<Configuration of TFT>

Figure 3:
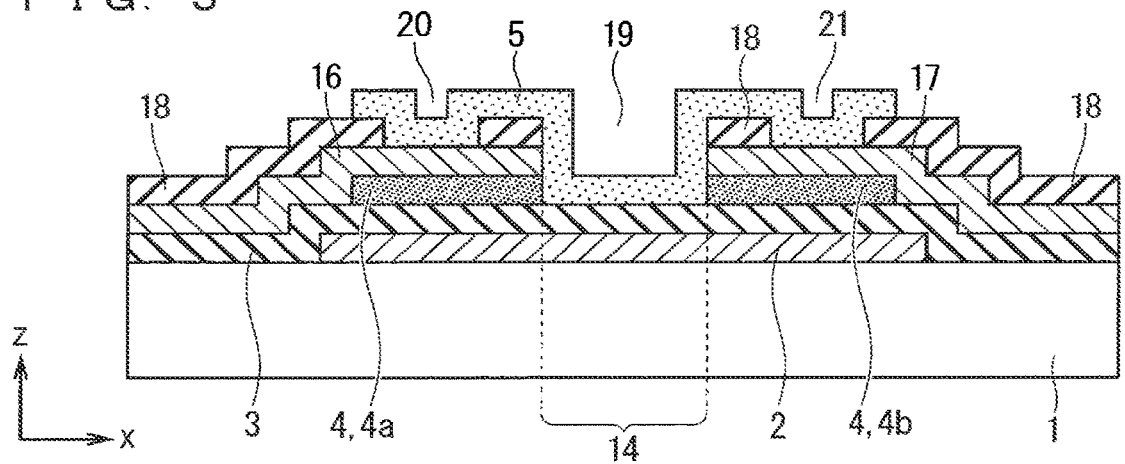
FIG. 3 is a sectional view showing a sectional structure of the TFT according to the first embodiment.

FIG. 2 is a plan view showing a planar structure of a TFT according to the first embodiment, and FIG. 3 is a sectional view showing a sectional structure thereof taken along the line A-A of FIG. 2. An XYZ rectangular coordinate system is additionally shown in FIGS. 2 and 3. The TFT according to the first embodiment is applicable as a basic configuration of the pixel TFTs 30 and the driving TFTs 40 (the NMOS transistors T1, T2, and T3) shown in FIGS. 1A and 1B. The structure of the TFT provided on the transparent insulative substrate 1 made of glass, for example, will be described below with reference to FIGS. 2 and 3.

A gate electrode 2 formed by a light-blocking conductive film made of metal or the like is selectively provided on the substrate 1. A gate insulation film 3 which is a first insulation film is provided on the entire upper surface of the substrate 1 so as to cover the gate electrode 2. A first semiconductor layer 4 made of an oxide semiconductor is selectively provided on the gate insulation film 3 in part of a region overlapping the gate electrode 2 as seen in plan view (as seen from above) as shown in FIG. 2. Specifically, the first semiconductor layer 4 adjacent to a partial region 14 that is part of the gate insulation film 3 lying on the gate electrode 2 as seen in plan view is provided on the gate insulation film 3 lying on the gate electrode 2. In the section of FIG. 3, the partial region 14 is a region inside the gate insulation film 3 lying on the gate electrode 2.

In the first embodiment, the first semiconductor layer 4 includes two first semiconductor layers 4a and 4b. The two first semiconductor layers 4a and 4b are provided on two respective regions of the gate insulation film 3 lying on the gate electrode 2 which are divided from each other by the partial region 14. In this case, the first semiconductor layer 4a is provided on the left-hand side (on the side of a negative x direction) with respect to the center of the gate electrode 2 as seen in plan view, and the first semiconductor layer 4b is provided on the right-hand side (on the side of a positive x direction).

A source electrode 16 and a drain electrode 17 are selectively provided so as to cover part of the gate insulation film 3. Specifically, at least one of the source and drain electrodes 16 and 17 is provided on the gate insulation film 3 and the first semiconductor layer 4, and the source electrode 16 and the drain electrode 17 are provided so as to sandwich the partial region 14 therebetween as seen in plan view. In the first embodiment, the source electrode 16 is provided on the gate insulation film 3 and the left-hand first semiconductor layer 4a, and the drain electrode 17 is provided on the gate insulation film 3 and the right-hand first semiconductor layer 4b. The first semiconductor layers 4a and 4b may have the same shape as the source and drain electrodes 16 and 17 as seen in plan view or may have regions protruding from the source and drain electrodes 16 and 17.

An interlayer insulation film 18 which is a second insulation film is provided on the source electrode 16 and the drain electrode 17 except part of the source electrode 16 and part of the drain electrode 17. A channel opening portion 19 which exposes the partial region 14 is provided in the interlayer insulation film 18 over the partial region 14. A source electrode contact hole 20 which exposes the part of the source electrode 16 is provided in the interlayer insulation film 18 over the source electrode 16, and a drain electrode contact hole 21 which exposes the part of the drain electrode 17 is provided in the interlayer insulation film 18 over the drain electrode 17.

A second semiconductor layer 5 made of an oxide semiconductor is provided on the interlayer insulation film 18 so as to cover the channel opening portion 19, the source electrode contact hole 20, and the drain electrode contact hole 21. The second semiconductor layer 5 is in contact with part of the source electrode 16 through the source electrode contact hole 20 and is in contact with part of the drain electrode 17 through the drain electrode contact hole 21. Further, the second semiconductor layer 5 is in contact with the partial region 14 of the gate insulation film 3 and with the first semiconductor layers 4a and 4b through the channel opening portion 19. Thus, a region of the second semiconductor layer 5 which is sandwiched between the source electrode 16 and the drain electrode 17 on the gate insulation film 3 (a region of the second semiconductor layer 5 which overlies the partial region 14) serves as a principal channel region. The TFT according to the first embodiment is configured as described above.

Although not shown, a protective insulation film formed by a third insulation film may be provided on the second semiconductor layer 5 so as to cover the second semiconductor layer 5. Such a configuration is capable of protecting the second semiconductor layer 5 from process damages and external disturbances in process steps after the completion of the TFT to further improve the reliability of the TFT.

<Manufacturing Method>

A method of manufacturing the TFT according to the first embodiment will be described hereinafter with reference to the drawings. FIGS. 4 to 7 are sectional views showing process steps in the method of manufacturing the TFT according to the first embodiment. A sectional view showing the final process step corresponds to FIG. 3.

First, the substrate 1 which is a transparent insulative substrate made of glass or the like is cleaned using a cleaning liquid or pure water. In the first embodiment, a glass substrate having a thickness of 0.6 mm was used as the substrate 1. Then, a first conductive film which is the material of the gate electrode 2 is formed entirely on a first main surface of the cleaned substrate 1. One of the surfaces of the substrate 1 on which the gate electrode 2 is to be provided is defined as an upper main surface of the substrate 1.

For example, light-blocking metals such as chromium (Cr), molybdenum (Mo), titanium (Ti), copper (Cu), tantalum (Ta), tungsten (W) and aluminum (Al), and alloys prepared by adding at least one different element to these metal elements serving as a main component may be used as the first conductive film. An element serving as a main component shall refer to an element having the highest content of all elements constituting an alloy. Also, a laminated structure including at least two of these metal layers or alloy layers may be used as the first conductive film. The use of these metals or alloys provides the low-resistance first conductive film having a resistivity value of not greater than 50 μΩcm, for example. In the first embodiment, a Mo film serving as the first conductive film was formed to a thickness of 200 nm by a sputtering method using argon (Ar) gas.

Figure 4:
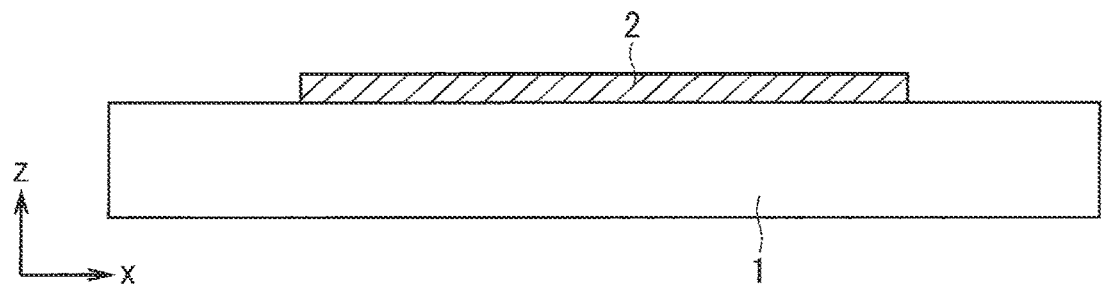
FIG. 4 is a sectional view showing a step for manufacturing the TFT according to the first embodiment.

Thereafter, a photoresist material is applied onto the first conductive film. A photoresist pattern is formed in the first photolithographic step. The first conductive film is patterned by etching with the use of the photoresist pattern as a mask. In this process, wet etching using a solution (Phosphoric-Acetic-Nitric acid; PAN chemical liquid) containing phosphoric acid, acetic acid, and nitric acid was used. Thereafter, the photoresist pattern is removed, whereby the gate electrode 2 is formed on the upper main surface of the substrate 1, as shown in FIG. 4.

Next, an insulation film which becomes the gate insulation film 3 is formed on the entire upper main surface of the substrate 1 so as to cover the gate electrode 2.

In the first embodiment, a chemical vapor deposition (CVD) method was used to form a silicon nitride film (SiN) and a silicon oxide film (SiO) in the order named, thereby forming the insulation film. The silicon oxide film, which contains oxygen (O) atoms, is capable of suppressing influence resulting from the diffusion (emission) of O atoms from a first oxide semiconductor film into the insulation film when the first oxide semiconductor film is formed on the insulation film in a subsequent step. On the other hand, the SiO film is poor in barrier properties (blocking properties) against impurity elements exerting influence on TFT properties such as moisture ($H_2O$), hydrogen ($H_2$), sodium (Na), and potassium (K). For this reason, the SiN film excellent in barrier properties was provided under the SiO film in the first embodiment. More specifically, the insulation film was a laminated film comprised of the SiN film having a thickness of 400 nm and the SiO film having a thickness of 50 nm. The insulation film formed in this process functions as the gate insulation film 3 in a TFT portion.

Next, the first oxide semiconductor film which is the material of the first semiconductor layer 4 is formed on the gate insulation film 3. In the first embodiment, an oxide (e.g., InGaZnO) containing In, Ga, and Zn was used for the first oxide semiconductor film. More specifically, an InGaZnO film having a thickness of 50 nm was formed by a sputtering method using an InGaZnO target [$In_2O_3 \cdot Ga_2O_3 \cdot (ZnO)_2$] having an In:Ga:Zn:O atomic composition ratio of 1:1:1:4.

Figure 5:
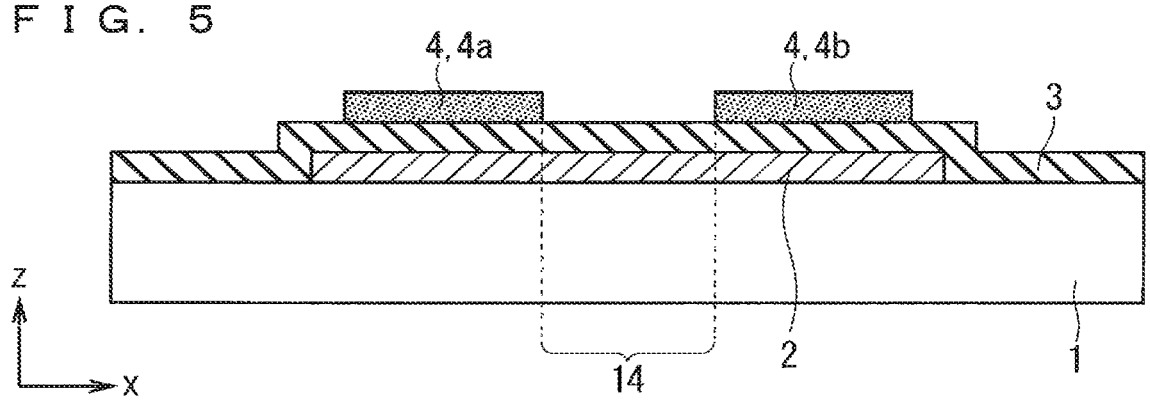
FIG. 5 is a sectional view showing a step for manufacturing the TFT according to the first embodiment.

Thereafter, a photoresist pattern is formed in the second photolithographic step. The first oxide semiconductor film is patterned by etching with the use of the photoresist pattern as a mask. In this process, wet etching using a solution containing oxalic acid (dicarboxylic acid) was used. Thereafter, the photoresist pattern is removed, whereby the first semiconductor layers 4a and 4b separated from each other are formed on the gate insulation film 3, as shown in FIG. 5.

Next, a second conductive film which is the material of the source electrode 16 and the drain electrode 17 is deposited in the same manner as the first conductive film. In the first embodiment, a Mo film having a thickness of 200 nm was formed as the second conductive film by a sputtering method using argon (Ar) gas.

Figure 6:
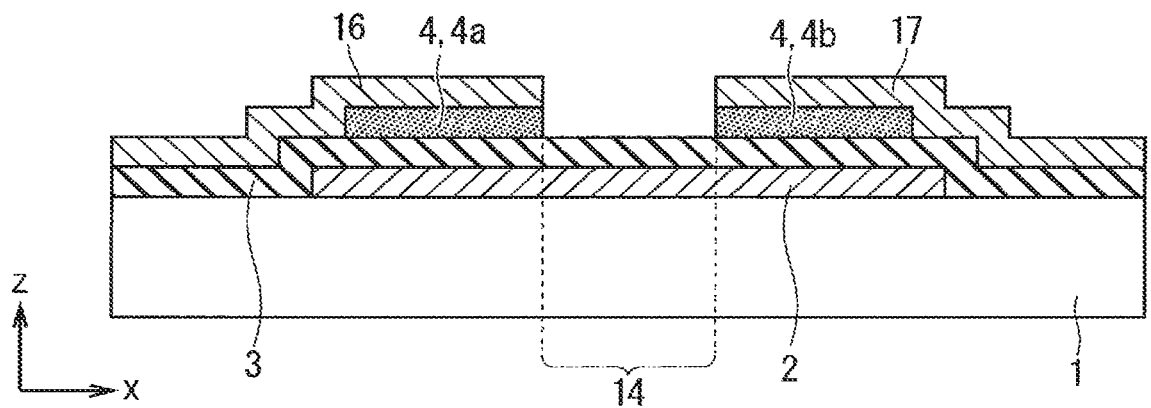
FIG. 6 is a sectional view showing a step for manufacturing the TFT according to the first embodiment.

Thereafter, a photoresist pattern is formed in the third photolithographic step. The second conductive film is patterned by etching with the use of the photoresist pattern as a mask. In this process, wet etching using the PAN chemical liquid was used. Thereafter, the photoresist pattern is removed, whereby the source electrode 16 and the drain electrode 17 are formed, as shown in FIG. 6.

The partial region 14 of the gate insulation film 3 is exposed between the source electrode 16 and the drain electrode 17. The partial region 14 is formed in the region overlapping the gate electrode 2 as seen in plan view (FIG.

2). That is, a region of the gate insulation film 3 which lies between the source electrode 16 and the drain electrode 17 becomes the partial region 14.

The source electrode 16 is formed so as to overlie the first semiconductor layer 4a, and the drain electrode 17 is formed so as to overlie the first semiconductor layer 4b. In this case, the first semiconductor layers 4a and 4b may have the same shape as the source and drain electrodes 16 and 17 as seen in plan view or may have regions protruding from the source and drain electrodes 16 and 17.

Next, an insulation film which is the material of the interlayer insulation film 18 is formed on the entire upper main surface of the substrate 1 including the source electrode 16 and the drain electrode 17. In the first embodiment, a CVD method was used to deposit a SiO film having a thickness of 150 nm and a SiN film having a thickness of 50 nm in the order named, thereby forming the insulation film.

Thereafter, a photoresist pattern is formed in the fourth photolithographic step. The SiO film and the SiN film are patterned by etching with the use of the photoresist pattern as a mask. In this process, dry etching using a gas prepared by adding oxygen ($O_2$) to sulfur hexafluoride ($SF_6$) was used.

Figure 7:
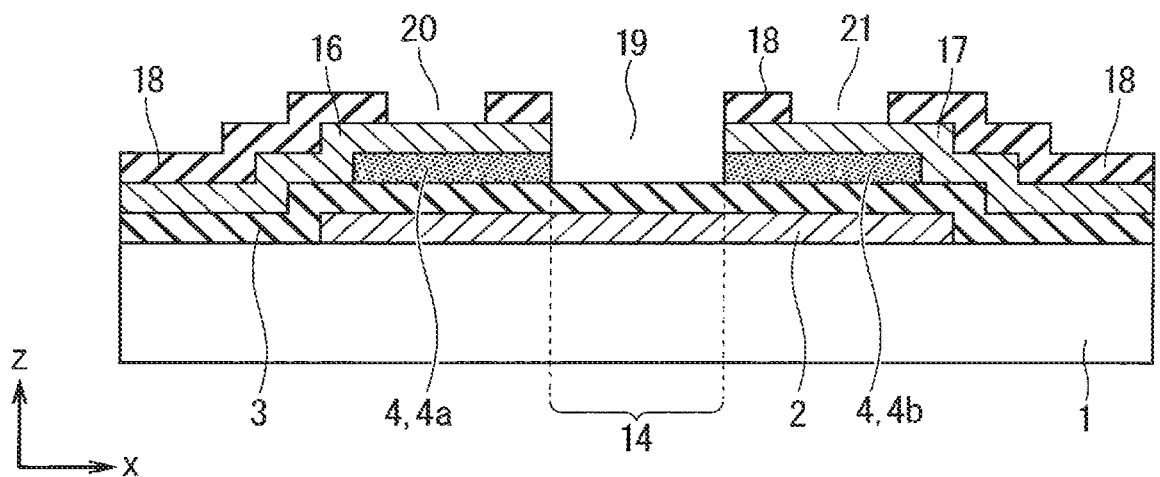
FIG. 7 is a sectional view showing a step for manufacturing the TFT according to the first embodiment.

Thereafter, the photoresist pattern is removed, whereby the channel opening portion 19 which exposes the partial region 14 of the gate insulation film 3, the source electrode contact hole 20 which exposes part of the source electrode 16, and the drain electrode contact hole 21 which exposes part of the drain electrode 17 are formed in the insulation film, as shown in FIG. 7. Thus, the interlayer insulation film 18 is formed.

Next, a second oxide semiconductor film is deposited on the entire upper main surface of the substrate 1 so as to cover the channel opening portion 19, the source electrode contact hole 20, and the drain electrode contact hole 21. In the first embodiment, an oxide (e.g., InGaZnO) containing In, Ga, and Zn was used for the second oxide semiconductor film. More specifically, an InGaZnO film having a thickness of 50 nm was formed by a sputtering method using an InGaZnO target [$In_2O_3 \cdot Ga_2O_3 \cdot (ZnO)_2$] having an In:Ga:Zn:O atomic composition ratio of 1:1:1:4.

Thereafter, a photoresist pattern is formed in the fifth photolithographic step. The second oxide semiconductor film is patterned by etching with the use of the photoresist pattern as a mask. In this process, wet etching using a solution containing oxalic acid was used. Thereafter, the photoresist pattern is removed, whereby the second semiconductor layer 5 is formed, as shown in FIG. 3.

The second semiconductor layer 5 is connected to the part of the source electrode 16 through the source electrode contact hole 20, and is connected to the part of the drain electrode 17 through the drain electrode contact hole 21. The second semiconductor layer 5 is further in contact with side surfaces of the source electrode 16 and the drain electrode 17 through the channel opening portion 19, and is in contact with side surfaces of the first semiconductor layers 4a and 4b therethrough. With such a configuration, the second semiconductor layer 5 has the principal channel region in a region lying under the channel opening portion 19 and between a structure comprised of the source electrode 16 and the first semiconductor layer 4a and a structure comprised of the drain electrode 17 and the first semiconductor layer 4b (a region overlying the partial region 14).

As described above, a transistor structure which includes the source electrode 16, the drain electrode 17, the gate electrode 2, and the gate insulation film 3 and which has a channel region including part of the first semiconductor layers 4a and 4b lying under the source and drain electrodes 16 and 17 and the principal channel region of the second semiconductor layer 5, i.e. the TFT according to the first embodiment, is produced through the five photolithographic steps.

Gist of First Embodiment

The TFT according to the first embodiment, in which an oxide semiconductor is used as the materials of the first semiconductor layer 4 and the second semiconductor layer 5, thus a transistor structure having a channel path with high mobility is provided. In the TFT according to the first embodiment, a gate electric field is applied from the gate electrode 2 to the first semiconductor layers 4a and 4b lying under the source and drain electrodes 16 and 17, so that a current path is formed in a region where the source and drain electrodes 16 and 17 overlap the first semiconductor layers 4a and 4b as seen in plan view. Thus, part of the first semiconductor layers 4a and 4b in which the current path is formed in addition to the principal channel region of the second semiconductor layer 5 functions as the channel region of the pixel TFT 30. As a result, this reduces the contact resistance between the source and drain electrodes 16 and 17 and the channel region to achieve a high-performance TFT having a higher on-state current than the conventional TFTs having the inverted coplanar structure. Further, the TFT according to the first embodiment is structured to have a smaller overlap region between the semiconductor layer and the source and drain electrodes than the ES structure, thereby achieving reductions in size and parasitic capacitance of the TFT.

In addition, the TFT according to the first embodiment is configured so that the second semiconductor layer 5 having the principal channel region is formed after the source electrode 16 and the drain electrode 17 are formed. This provides the TFT having the channel region with high reliability. Specifically, the defect density (damage) of the surface of the channel region in the TFT according to the first embodiment is suppressed as compared with that in the conventional BCE structure because the principal channel region of the second semiconductor layer 5 is not exposed to the chemical liquid for the wet etching during the formation of the source electrode 16 and the drain electrode 17. As a result, this suppresses degradation resulting from defects to provide a long-life high-reliability TFT.

The TFT according to the first embodiment may be configured such that the interlayer insulation film 18 is formed after the source electrode 16 and the drain electrode 17 are formed and such that the contact between the second semiconductor layer 5 and the source and drain electrodes 16 and 17 is made only through the source electrode contact hole 20 and the drain electrode contact hole 21 which are formed in the interlayer insulation film 18. Such a configuration suppresses property degradation resulting from the diffusion of metal atoms constituting the source and drain electrodes 16 and 17 into the semiconductor channel region during the deposition of the second oxide semiconductor film by means of the sputtering method. Therefore, a TFT having a channel region with higher reliability than the conventional inverted coplanar structure is provided.

It is preferable that the carrier density of the first semiconductor layer 4 (4a and 4b) is higher than that of the second semiconductor layer 5. Such a configuration further reduces the contact resistance between the source and drain electrodes 16 and 17 and the first semiconductor layers 4a and 4b. Also, carriers are diffused from a region of the first semiconductor layer 4 which has a high carrier density to the principal channel region of the second semiconductor layer 5 which has a low carrier density, whereby a shift of the threshold voltage (Vth) of the TFT during the application of a positive bias is suppressed. As a result, the reliability of the TFT is further increased. Details related to this are described, for example, in a document (S. H. Ha, D. H. Kang, I. Kang, J. U. Han, M. Mativenga, and J. Jang, "Channel Length Dependent Bias-Stability of Self-Aligned Coplanar a-IGZO TFTs," IEEE/OSA Journal of Display Technology, 2013, vol. 9, no. 12, pp. 985-988).

The use of the TFT of the first embodiment as each of the pixel TFTs 30 of the TFT substrate 100 provides the TFT substrate 100 having high reliability and high switching performance. This also makes the size of the pixel TFTs 30 smaller than the conventional TFTs in which a-Si is used for the channel layer to increase the aperture ratio of the pixels, thereby providing energy savings of the LCD.

Further, the use of the TFT of the first embodiment as each of the driving TFTs 40 included in at least one of the scanning signal driving circuit 25 and the display signal driving circuit 26 which are provided on the TFT substrate 100 provides the TFT substrate 100 of a driving circuit containing type with high reliability to achieve the cost reduction of the LCD.

In the aforementioned first embodiment, the interlayer insulation film 18 is provided with the channel opening portion 19, the source electrode contact hole 20, and the drain electrode contact hole 21. The first embodiment, however, is not limited to this. For example, as shown in plan view of FIG. 8 and in sectional view of FIG. 9, the source electrode contact hole 20 and the drain electrode contact hole 21 need not be provided in a configuration where an end portion of the source electrode 16 which is on the partial region 14 side and an end portion of the drain electrode 17 which is on the partial region 14 side are provided so as to be exposed from the channel opening portion 19.

Figure 8:
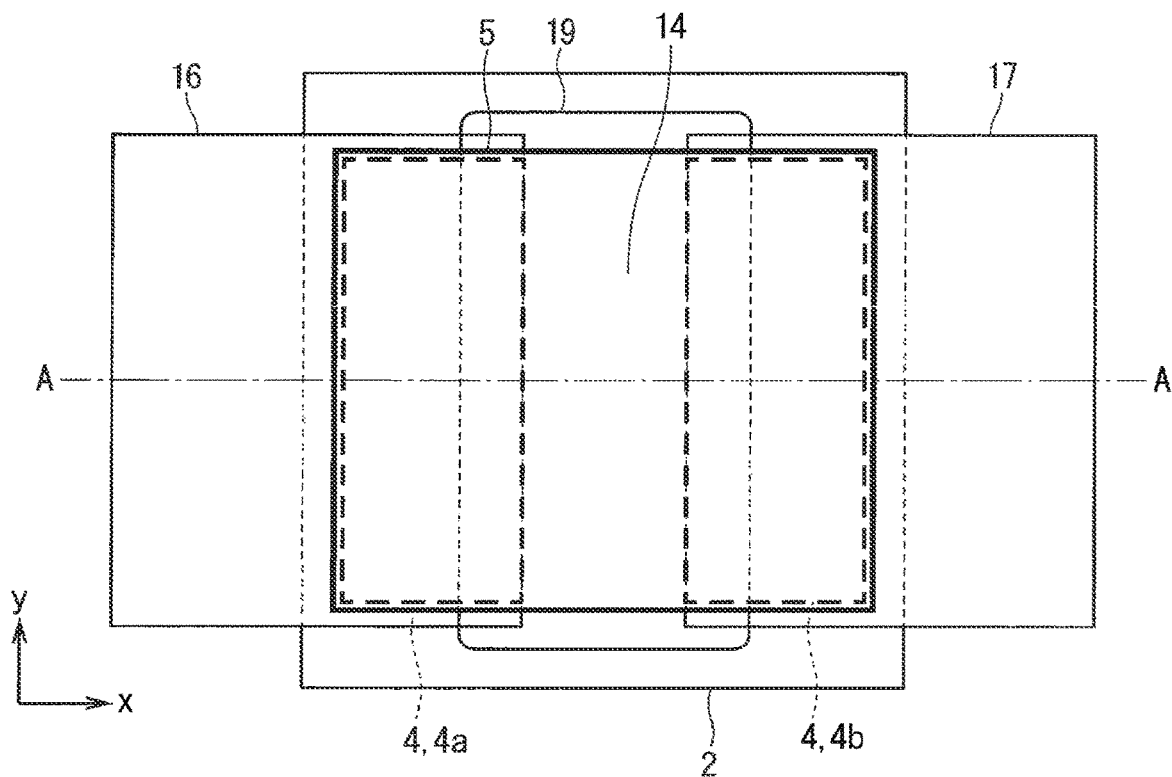
FIG. 8 is a plan view showing a planar structure of a different TFT according to the first embodiment.
Figure 9:
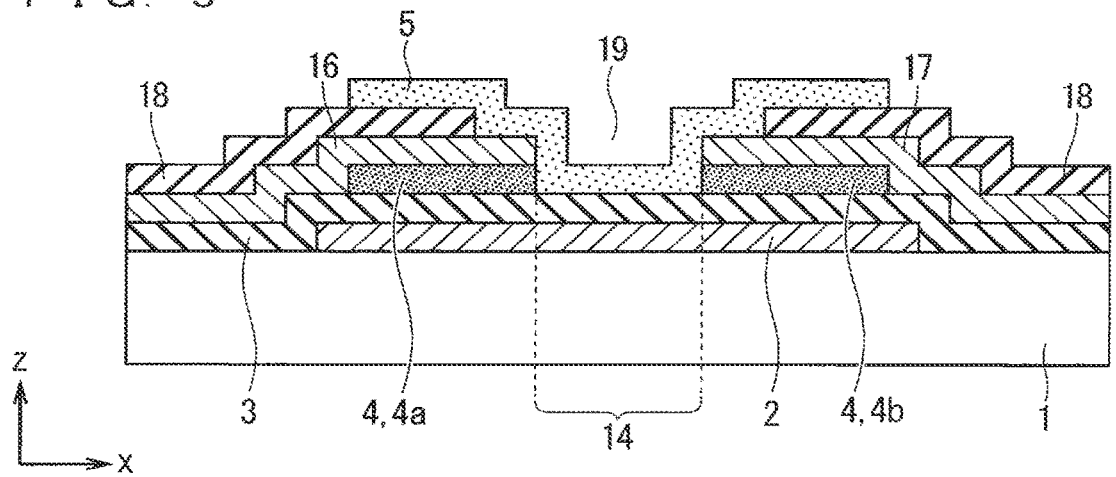
FIG. 9 is a sectional view showing a sectional structure of the different TFT according to the first embodiment.

The configuration as shown in FIGS. 8 and 9 further reduces the area of the source and drain electrodes 16 and 17 exposed from the interlayer insulation film 18 as seen in plan view. This further suppresses property degradation resulting from the diffusion of the metal atoms constituting the source and drain electrodes 16 and 17 into the semiconductor channel region during the deposition of the second oxide semiconductor film which becomes the second semiconductor layer 5 by means of the sputtering method. Therefore, a TFT having a channel region with higher reliability is provided.

First Modification

Figure 10:
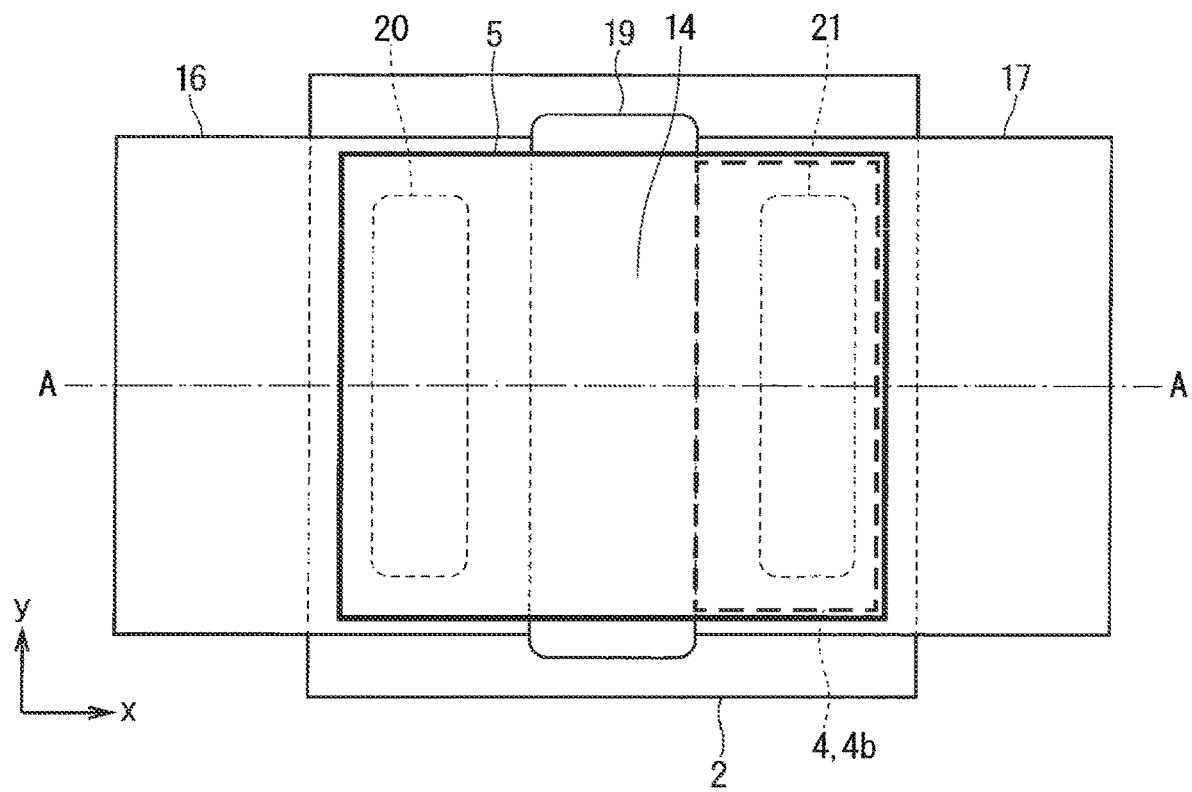
FIG. 10 is a plan view showing a planar structure of the TFT according to a first modification of the first embodiment.
Figure 11:
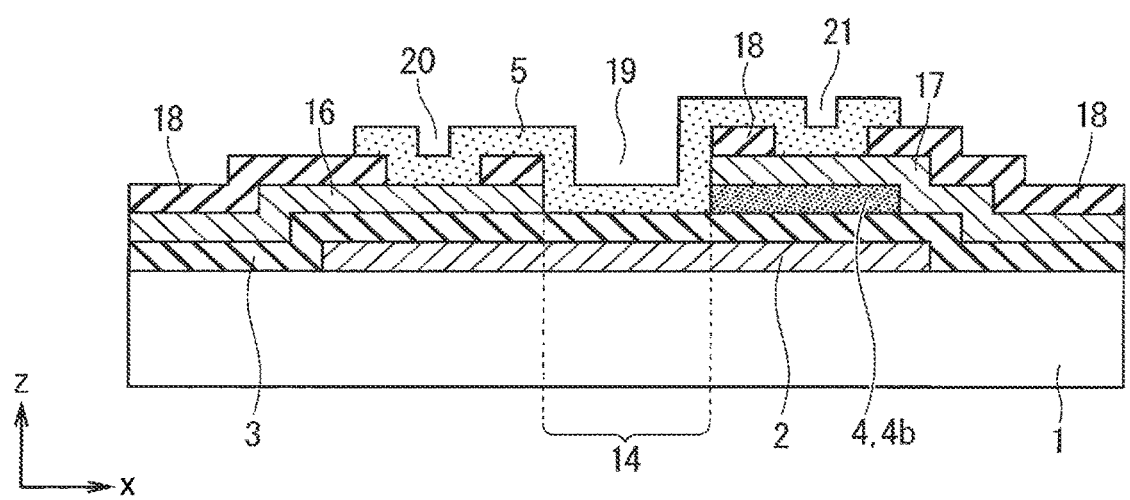
FIG. 11 is a sectional view showing a sectional structure of the TFT according to the first modification of the first embodiment.

FIGS. 10 and 11 are views showing a planar structure and a sectional structure, respectively, of the TFT according to a first modification of the first embodiment. Components corresponding to those in the first embodiment are designated by the same reference numerals and characters. As shown in FIGS. 10 and 11, the first semiconductor layer 4 (4b) is provided only under the drain electrode 17 in the TFT of the first modification.

In the TFT having such a structure, the reduction in contact resistance between the drain electrode 17 and the channel region is achieved because the drain electrode 17 and the first semiconductor layer 4b overlap each other as seen in plan view. Although the first semiconductor layer 4b is provided only under the drain electrode 17 in the first modification, the first semiconductor layer 4 (4a) may be provided only under the source electrode 16.

That is, if at least one of the source electrode 16 and the drain electrode 17 is provided on the gate insulation film 3 and the first semiconductor layer 4, the gate electric field is applied from the gate electrode 2 to the first semiconductor layer 4 lying under the at least one electrode. As a result, a current path is formed in a region where the at least one electrode overlaps the first semiconductor layer 4 as seen in plan view, so that the contact resistance between the electrode and the channel region is suppressed.

Second Modification

In the TFT of the aforementioned first embodiment, the source electrode 16 is provided so as to overlie the first semiconductor layer 4a, and the drain electrode 17 is provided so as to overlie the first semiconductor layer 4b. The shape of the end surface portions of the first semiconductor layers 4a and 4b on the channel opening portion 19 side is substantially the same as that of the end surface portions of the source and drain electrodes 16 and 17. However, the first semiconductor layer 4 may have regions protruding from the source and drain electrodes 16 and 17.

Figure 12:
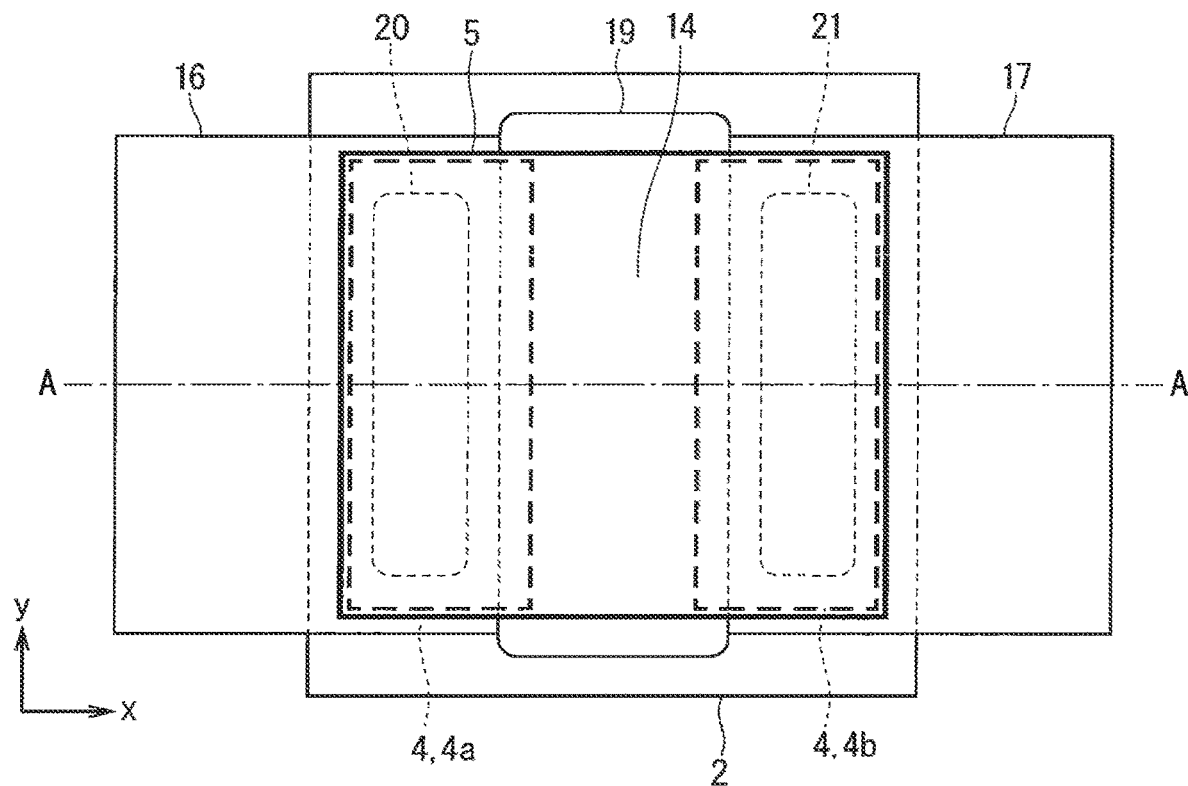
FIG. 12 is a plan view showing a planar structure of the TFT according to a second modification of the first embodiment.
Figure 13:
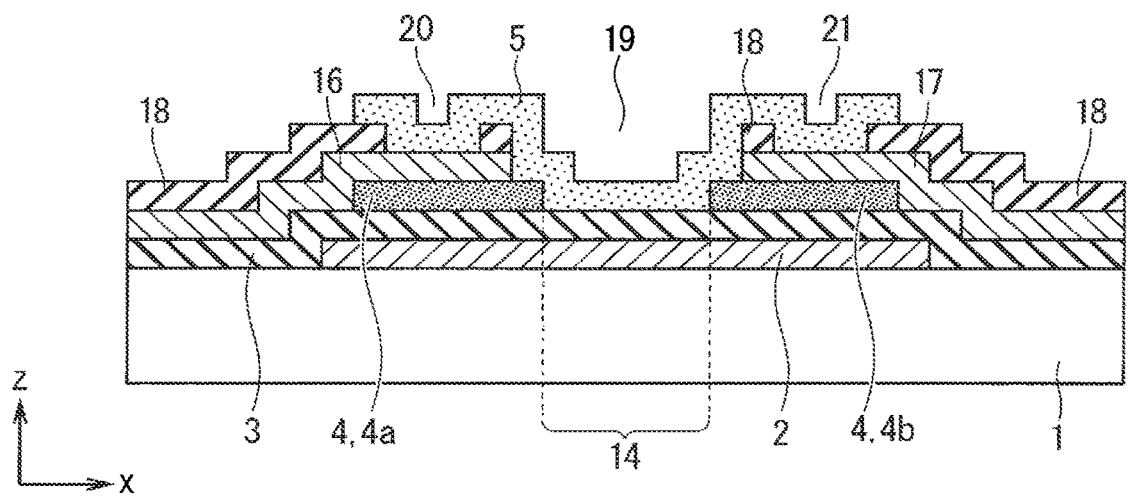
FIG. 13 is a sectional view showing a sectional structure of the TFT according to the second modification of the first embodiment.

FIGS. 12 and 13 are views showing a planar structure and a sectional structure, respectively, of the TFT according to a second modification of the first embodiment. Components corresponding to those in the first embodiment are designated by the same reference numerals and characters. As shown in FIGS. 12 and 13, the end surface portions of the first semiconductor layers 4a and 4b in the second modification protrude from the end surface portions of the source and drain electrodes 16 and 17 toward the principal channel region. That is, when the first semiconductor layer 4 is provided under the source electrode 16, the first semiconductor layer 4 is provided so as to protrude from the source electrode 16 toward the partial region 14 as seen in plan view. When the first semiconductor layer 4 is provided under the drain electrode 17, the first semiconductor layer 4 is provided so as to protrude from the drain electrode 17 toward the partial region 14 as seen in plan view.

In the TFT of the second modification, the second semiconductor layer 5 is in contact with part of the source electrode 16 through the source electrode contact hole 20, and is in contact with part of the drain electrode 17 through the drain electrode contact hole 21. Further, the second semiconductor layer 5 is in contact with the partial region 14 of the gate insulation film 3 and with not only the side surfaces but also the upper surfaces of the first semiconductor layers 4a and 4b through the channel opening portion 19. Thus, a region of the second semiconductor layer 5 which is sandwiched between the source electrode 16 and the drain electrode 17 on the gate insulation film 3 (a region of the second semiconductor layer 5 which overlies the partial region 14) serves as the principal channel region.

The configuration of the second modification as described above is capable of establishing better connection between the principal channel region of the second semiconductor layer 5 and the first semiconductor layer 4 to achieve the operation of the channel region with higher stability than the TFT of the first embodiment.

In the TFTs of the first embodiment, the first modification thereof, and the second modification thereof, it is preferable that the first semiconductor layer 4 and the second semiconductor layer 5 which are formed by the oxide semiconductor films are provided in a region inside the gate electrode 2 as seen in plan view. For example, there are cases in which these TFTs are applied to a transmission type LCD including a backlight unit on the back surface of the substrate 100 and displaying images by directing a backlight beam from the back surface of the substrate 100. In such cases, if the first semiconductor layer 4 or the second semiconductor layer 5 is provided so as to protrude from the gate electrode 2 as seen in plan view, there is a problem that the backlight beam causes photo-deterioration of the first semiconductor layer 4 or the second semiconductor layer 5 to cause property degradation of the TFTs. As a measure to work around this problem, it is preferable that the first semiconductor layer 4 and the second semiconductor layer 5 are provided in a region inside the gate electrode 2 which blocks the backlight beam. The photo-deterioration (photosensitivity) of the properties of an oxide semiconductor film is described, for example, in a document (Chiao-Shun Chuang, Tze-Ching Fung, Barry G. Mullins, Kenji Nomura, Toshio Kamiya, Han-Ping David Shieh, Hideo Hosono and Jerzy Kanicki, "Photosensitivity of Amorphous IGZO TFTs for Active-Matrix Flat-Panel Displays", SID 08 DIGEST, 2008, pp. 1215-1218).

SECOND EMBODIMENT

In a second embodiment according to the present invention, the pixel TFTs 30 for use in the FFS mode LCD are provided on the TFT substrate 100 of the first embodiment. The FFS mode pixel TFTs 30 according to the second embodiment, as well as a pixel electrode structure, will be described hereinafter in detail with reference to the drawings.

Figure 14:
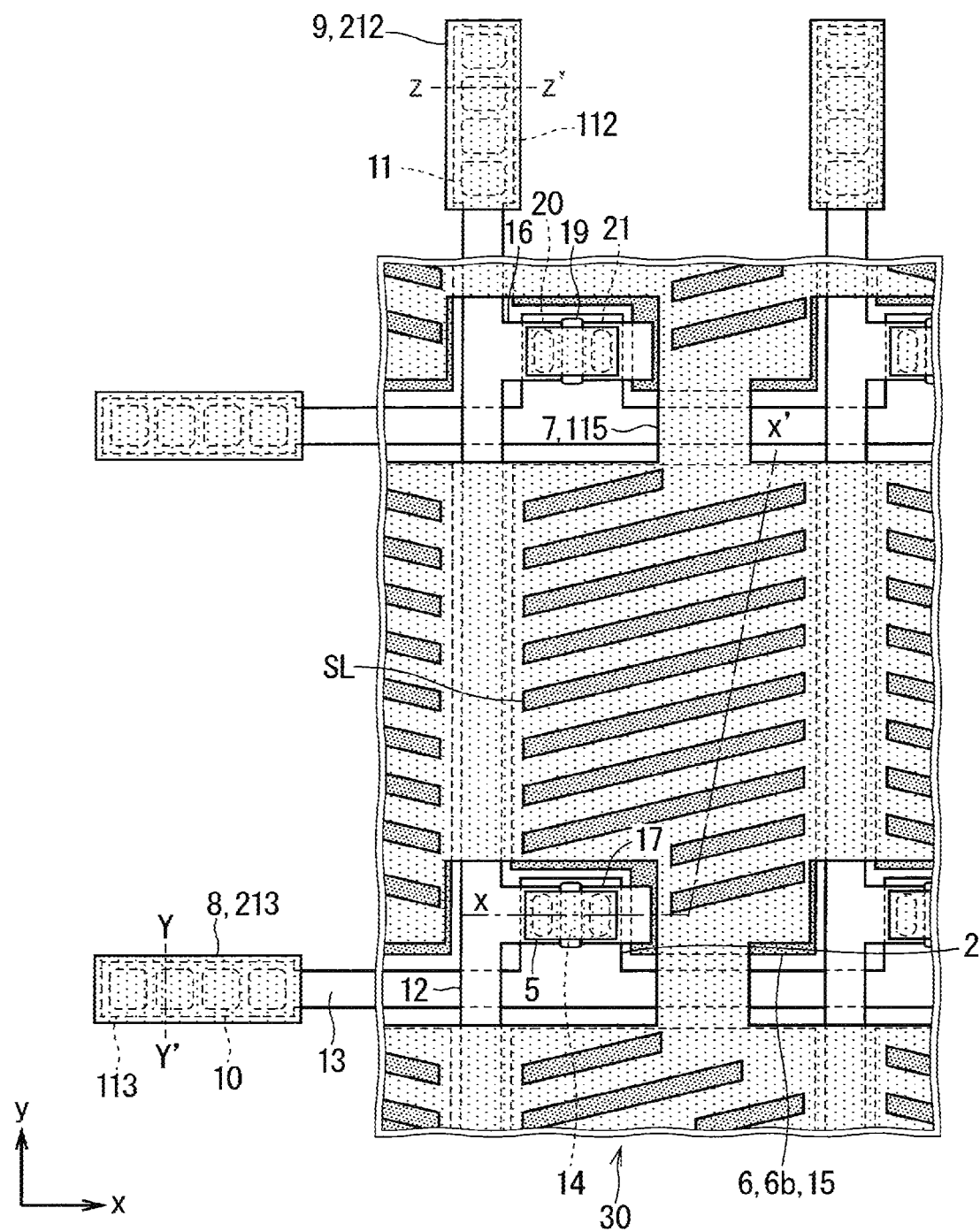
FIG. 14 is a plan view showing a planar structure of a pixel TFT according to a second embodiment.
Figure 15:
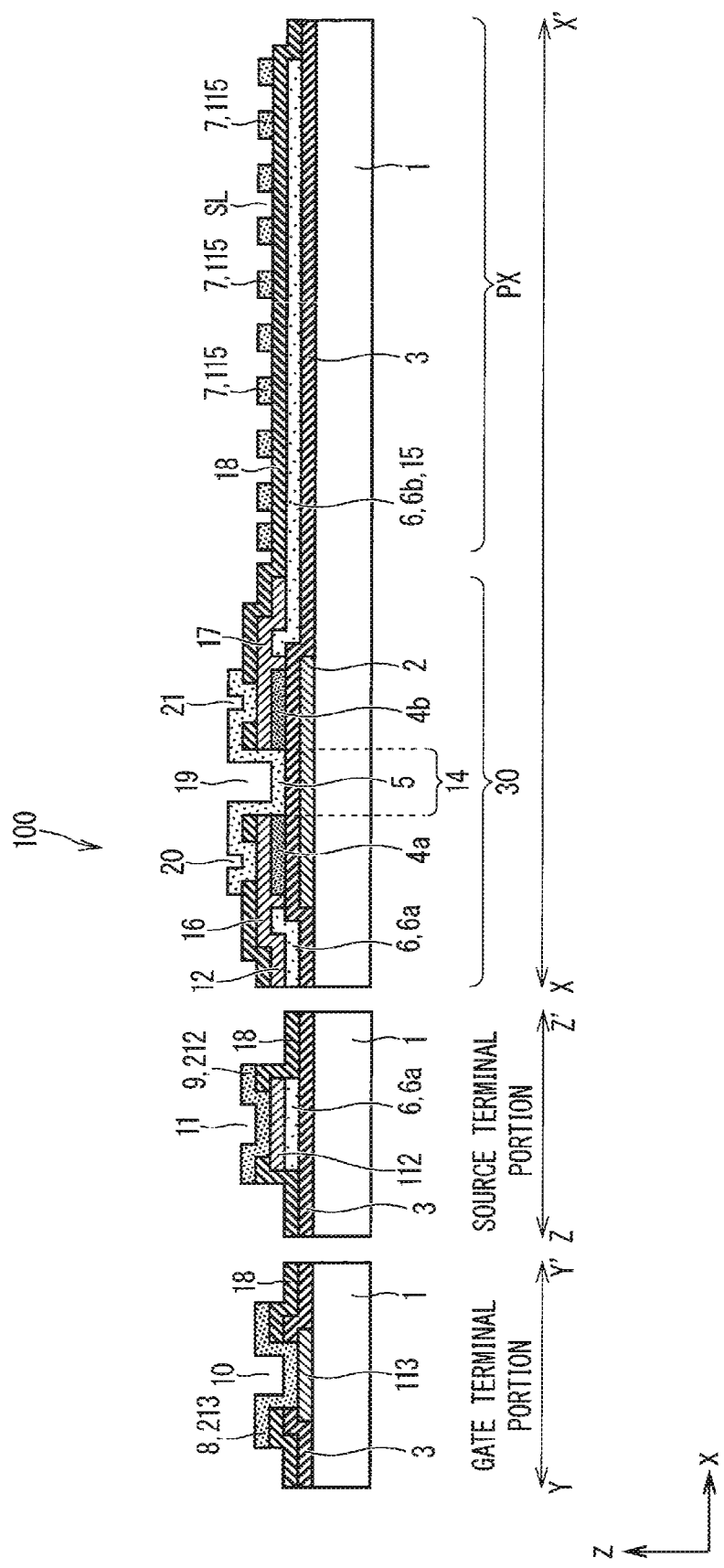
FIG. 15 is a sectional view showing a sectional structure of the pixel TFT according to the second embodiment.

FIG. 14 is a plan view showing a configuration of a pixel portion of the TFT substrate 100 having the pixel TFTs 30 according to the second embodiment. FIG. 15 is a sectional view showing sectional configurations taken along the lines X-X', Y-Y', and Z-Z' of FIG. 14 (sectional configurations of a pixel TFT 30 and a pixel region PX and sectional configurations of a gate terminal portion and a source terminal portion). Components in the second embodiment corresponding to those in the first embodiment are designated by the same reference numerals and characters.

The plurality of source interconnect lines 12 and the plurality of gate interconnect lines 13 of FIG. 14 (although only two source interconnect lines 12 and two gate interconnect lines 13 are shown in FIG. 14) are disposed in a matrix on the substrate 1 of FIG. 15. The gate interconnect lines 13 extend in an x direction as seen in plan view, and have respective end portions provided with gate terminals 113 and gate terminal pads 213. The source interconnect lines 12 extend in a y direction as seen in plan view, and have respective end portions provided with source terminals 112 and source terminal pads 212. The gate terminal pads 213 are connected to the scanning signal driving circuit 25 of FIG. 1A which provides a driving voltage to the gate interconnect lines 13. The source terminal pads 212 are connected to the display signal driving circuit 26 of FIG. 1A which provides a driving voltage to the source interconnect lines 12.

The pixel TFTs 30 are disposed in corresponding relation to intersection portions of the gate interconnect lines 13 and the source interconnect lines 12, and the pixel electrodes 15 and a counter electrode 115 are disposed in corresponding relation to the pixel TFTs 30. That is, a pixel TFT 30, a pixel electrode 15, and the counter electrode 115 which are provided as a unit are disposed in each pixel region PX of FIG. 1A provided between two gate interconnect lines 13 and two source interconnect lines 12.

As shown in FIG. 15, the pixel electrode 15 and the counter electrode 115 are disposed in opposed relation, with the interlayer insulation film 18 therebetween, as seen in sectional view. In the second embodiment, the counter electrode 115 is provided in a continuous shape extending over pixels adjacent to each other in the x and y directions of FIG. 14. The TFT substrate 100 is configured so that a signal at a fixed common potential is supplied from an end portion of the display region 24 (FIG. 1A) of the TFT substrate 100 to the counter electrode 115. The counter electrode 115 is provided with a plurality of slit opening portions SL. When a voltage is applied between the pixel electrode 15 and the counter electrode 115, the counter electrode 115 is able to generate an electric field (fringe field) starting from an end side (fringe) portion of the slit opening portions SL and substantially horizontal with respect to a surface of the TFT substrate 100 over the counter electrode 115. This allows the acquisition of what is called a FFS mode liquid crystal driving function which drives liquid crystal molecules on the pixel electrode 15 with the use of the horizontal electric field. Although the slit opening portions SL are provided in the counter electrode 115 in the second embodiment, an opening having a continuous zigzag end side like a comb tooth shape may be provided in the counter electrode 115.

Electrical connections are established between the gate interconnect lines 13 and the gate electrodes 2 of the pixel TFTs 30. Electrical connections are established between the source interconnect lines 12 and the source electrodes 16 of the pixel TFTs 30. Electrical connections are established between the pixel electrodes 15 and the drain electrodes 17 of the pixel TFTs 30.

As shown in FIG. 15, a region corresponding to the pixel TFT 30 and the gate electrode 2 are provided on the substrate 1 made of glass, for example. The gate insulation film 3 is provided on the entire upper surface of the substrate 1 so as to cover the gate electrode 2.

The first semiconductor layer 4 (4a and 4b) and a third semiconductor layer 6 (6a and 6b) are provided on the gate insulation film 3 separately from each other (in spaced apart relation to each other). The first semiconductor layer 4 and the third semiconductor layer 6 are made of the same oxide semiconductor material and serve as the same layer. The first semiconductor layers 4a and 4b are connected to the second semiconductor layer 5 made of an oxide semiconductor. The third semiconductor layers 6a and 6b are not connected to the second semiconductor layer 5 but are disposed under the source and drain electrodes 16 and 17, respectively.

The third semiconductor layer 6b is provided so as to be opposite to the partial region 14 with respect to the first semiconductor layer 4b. A partial region of the third semiconductor layer 6b is provided under the drain electrode 17, and another partial region of the third semiconductor layer 6b functions as the transparent pixel electrode 15 in the pixel region PX. The pixel electrode 15 of the third semiconductor layer 6b is electrically connected through the drain electrode 17 to the second semiconductor layer 5 and the first semiconductor layer 4b. The third semiconductor layer 6b is converted into a conductor to have an electrical conductivity higher than that of the first semiconductor layers 4a and 4b.

As shown in FIG. 14, the source electrodes 16 are provided so as to branch off from the source interconnect lines 12 and to be continuous with the source interconnect lines 12, and the source terminals 112 are provided in end portions of the source interconnect lines 12. The third semiconductor layer 6a which is a semiconductor layer similar to the third semiconductor layer 6b is provided so as to be opposite to the partial region 14 with respect to the first semiconductor layer 4a. As shown in FIG. 15, the third semiconductor layer 6a is provided under a source interconnect line 12. The third semiconductor layer 6a in the second embodiment extends from under the source electrode 16 to under a source terminal 112. The third semiconductor layer 6a is converted into a conductor to have an electrical conductivity higher than that of the first semiconductor layers 4a and 4b.

A brief summary of the above is as follows. The source electrode 16 is provided on the first semiconductor layer 4a and the third semiconductor layer 6a, and the drain electrode 17 is provided on the first semiconductor layer 4b and the third semiconductor layer 6b. The pixel electrode 15 includes the third semiconductor layer 6b serving as the same layer as the first semiconductor layers 4a and 4b. The third semiconductor layer 6a serving as the same layer as similar to the third semiconductor layer 6b is provided under the source interconnect line 12.

The first semiconductor layers 4a and 4b and the third semiconductor layers 6a and 6b may or may not have regions protruding from the source electrode 16 and the drain electrode 17 as seen in plan view. In the second embodiment, the third semiconductor layer 6b in the pixel region PX protrudes from the drain electrode 17 as seen in plan view because it is necessary for the third semiconductor layer 6b in the pixel region PX to function as the transparent pixel electrode 15.

The first semiconductor layer 4a and the third semiconductor layer 6a may be integrated together using a continuous pattern unseparated from each other. It is, however, preferable that the first semiconductor layer 4a and the third semiconductor layer 6a are separated from each other as in the second embodiment because there is a possibility that the third semiconductor layer 6 converted into a conductor exerts adverse effects on semiconductor properties of the first semiconductor layer 4a. Similarly, it is preferable that the first semiconductor layer 4b and the third semiconductor layer 6b are separated from each other.

The interlayer insulation film 18 is provided on the entire upper main surface of the substrate 1 including the source electrode 16, the drain electrode 17, the pixel electrode 15, and the like. This interlayer insulation film 18 may be referred to as a protective insulation film. The channel opening portion 19 which exposes the partial region 14 is provided in the interlayer insulation film 18 over the partial region 14. The source electrode contact hole 20 which exposes part of the source electrode 16 is provided in the interlayer insulation film 18 over the source electrode 16, and the drain electrode contact hole 21 which exposes part of the drain electrode 17 is provided in the interlayer insulation film 18 over the drain electrode 17.

Further, a gate terminal contact hole 10 which exposes a surface of a gate terminal 113 in the gate terminal portion and a source terminal contact hole 11 which exposes a surface of a source terminal 112 in the source terminal portion are provided in the interlayer insulation film 18.

The second semiconductor layer 5 made of an oxide semiconductor is provided on the interlayer insulation film 18 so as to cover the channel opening portion 19, the source electrode contact hole 20, and the drain electrode contact hole 21. The second semiconductor layer 5 is in contact with part of the source electrode 16 through the source electrode contact hole 20 and is in contact with part of the drain electrode 17 through the drain electrode contact hole 21. Further, the second semiconductor layer 5 is in contact with the partial region 14 of the gate insulation film 3 and with side portions of the first semiconductor layers 4a and 4b through the channel opening portion 19. Thus, a region of the second semiconductor layer 5 which is sandwiched between the source electrode 16 and the drain electrode 17 on the gate insulation film 3 (a region of the second semiconductor layer 5 which overlies the partial region 14) serves as the principal channel region.

A fourth semiconductor layer 7 deposited using the same oxide semiconductor material as the second semiconductor layer 5 and serving as the same layer as the second semiconductor layer 5 is provided on the interlayer insulation film 18 in a region overlapping the pixel region PX. The fourth semiconductor layer 7 is provided over the pixel electrode 15 in opposed relation to the pixel electrode 15 as seen in plan view while being insulated from the pixel electrode 15. The fourth semiconductor layer 7 functions as the counter electrode 115 in the pixel region PX. The fourth semiconductor layer 7 is converted into a conductor to have an electrical conductivity higher than that of the second semiconductor layer 5. In the second embodiment, the counter electrode 115 is disposed in a continuous shape extending over pixels adjacent to each other in the x and y directions of FIG. 14, as mentioned above. The TFT substrate 100 is configured so that a signal at a fixed common potential is supplied from an end portion of the display region 24 (FIG. 1A of the TFT substrate 100 to the counter electrode 115.

A fifth semiconductor layer 8 deposited using the same oxide semiconductor material as the second semiconductor layer 5 and converted into a conductor so as to have an electrical conductivity higher than that of the second semiconductor layer 5 is provided on the interlayer insulation film 18 in the gate terminal portion. The fifth semiconductor layer 8 is connected through the gate terminal contact hole 10 to the gate terminal 113. The fifth semiconductor layer 8 functions as a gate terminal pad 213 for protecting the gate terminal 113.

A sixth semiconductor layer 9 deposited using the same oxide semiconductor material as the second semiconductor layer 5 and converted into a conductor so as to have an electrical conductivity higher than that of the second semiconductor layer 5 is provided on the interlayer insulation film 18 in the source terminal portion. The sixth semiconductor layer 9 is connected through the source terminal contact hole 11 to the source terminal 112. The sixth semiconductor layer 9 functions as a source terminal pad 212 for protecting the source terminal 112.

For assembly of a liquid crystal display panel, an alignment film and a spacer are initially formed on a surface of the TFT substrate 100 shown in FIGS. 14 and 15. The alignment film is a film for arranging liquid crystal, and is made of polyimide or the like. A separately produced counter substrate (not shown) including a color filter, an alignment film, and the like is affixed to the TFT substrate 100. At this time, a gap is formed between the TFT substrate and the counter substrate by the spacer. Liquid crystal is sealed in the gap. This provides a horizontal electric field driving FFS mode liquid crystal display panel. Finally, polarizing plates, a retardation film, a driving circuit, a backlight unit, and the like are disposed on the outside of the liquid crystal display panel, whereby a liquid crystal display device including the TFT substrate 100 and the counter substrate which hold the liquid crystal layer therebetween, specifically a FFS mode LCD, is completed.

Instead of providing the scanning signal driving circuit 25 and the display signal driving circuit 26 outside the liquid crystal display panel, the driving TFTs 40 of the scanning signal driving circuit 25 and the display signal driving circuit 26 may be disposed in the frame region 23 of the TFT substrate 100 through the use of the TFTs described in the first embodiment and the modifications thereof. In this case, the frame region of the LCD is narrowed, and the need for an external driving circuit board is eliminated. Thus, the FFS mode LCD is produced at low costs.

<Manufacturing Method>

A method of manufacturing the FFS mode TFT substrate 100 according to the second embodiment will be described hereinafter with reference to the drawings. FIGS. 16 to 19 are plan views showing process steps in the method of manufacturing the TFT substrate 100 according to the second embodiment. A plan view showing the final process step corresponds to FIG. 14. FIGS. 20 to 28 are sectional views showing process steps in the method of manufacturing the TFT substrate 100 according to the second embodiment. A sectional view showing the final process step corresponds to FIG. 15.

First, the substrate 1 which is a transparent insulative substrate made of glass or the like is cleaned using a cleaning liquid or pure water. In the second embodiment, a glass substrate having a thickness of 0.6 mm was used as the substrate 1. Then, the first conductive film which is the material of the gate electrode 2 and the like is formed entirely on the first main surface of the cleaned substrate 1. One of the surfaces of the substrate 1 on which the gate electrode 2 and the like are to be provided is defined as the upper main surface of the substrate 1.

For example, light-blocking metals such as Cr, Mo, Ti, Cu, Ta, W and Al, and alloys prepared by adding at least one different element to these metal elements serving as a main component may be used as the first conductive film. An element serving as a main component shall refer to an element having the highest content of all elements constituting an alloy. Also, a laminated structure including at least two of these metal layers or alloy layers may be used as the first conductive film. The use of these metals or alloys provides the low-resistance first conductive film having a resistivity value of not greater than 50 μΩcm, for example. In the second embodiment, a light-blocking Mo film serving as the first conductive film was formed to a thickness of 200 nm by a sputtering method using Ar gas.

Figure 16:
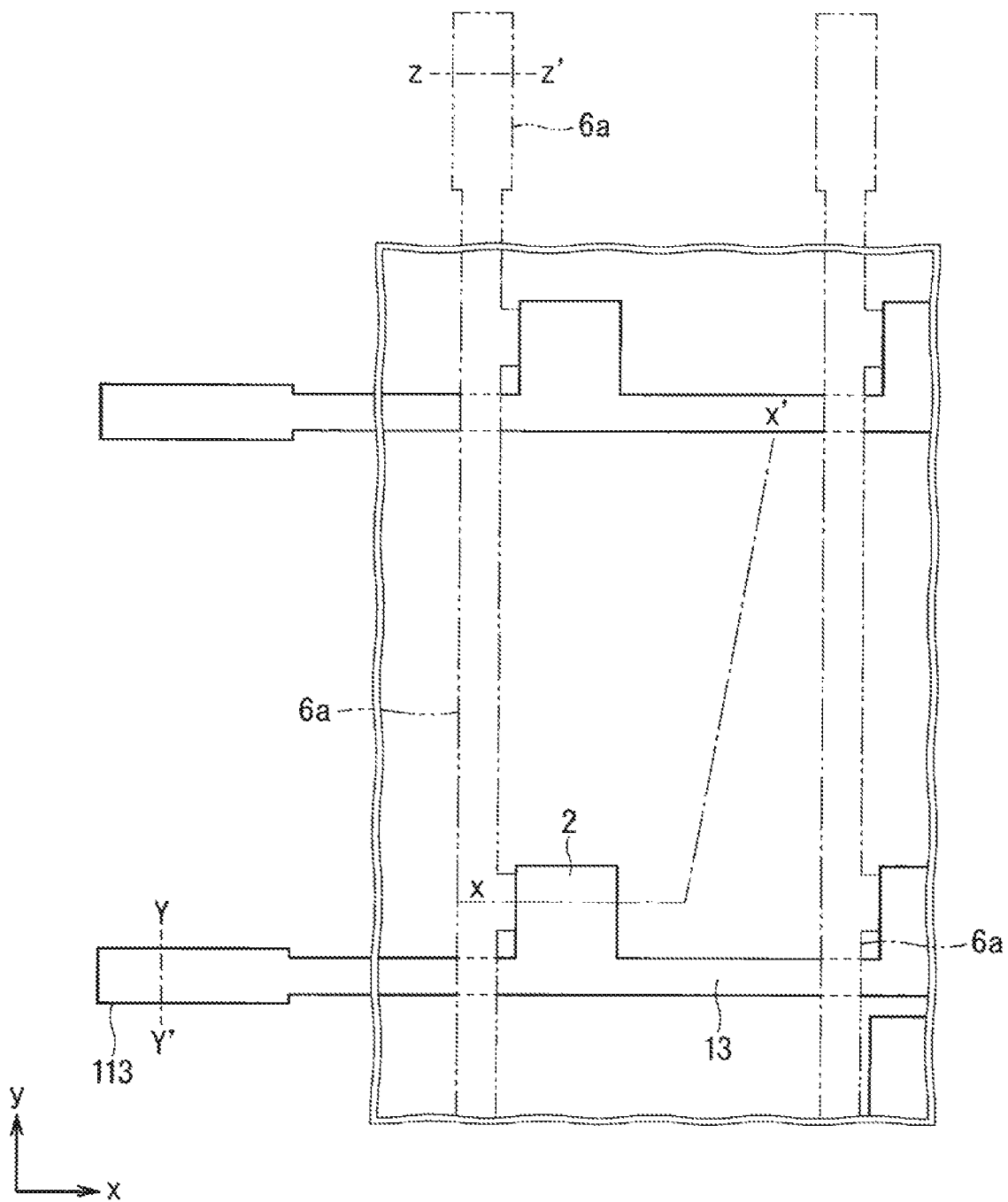
FIG. 16 is a plan view showing a step for manufacturing the pixel TFT according to the second embodiment.
Figure 20:
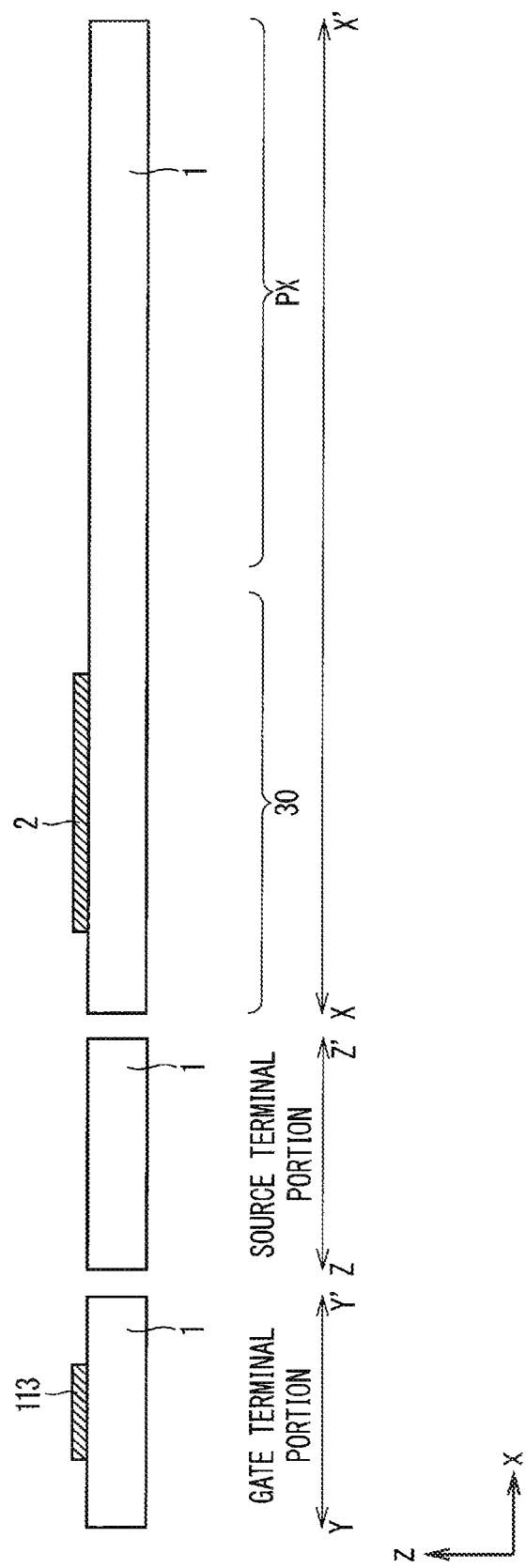
FIG. 20 is a sectional view showing a step for manufacturing the pixel TFT according to the second embodiment.

Thereafter, a photoresist material is applied onto the first conductive film. A photoresist pattern is formed in the first photolithographic step. The first conductive film is patterned by etching with the use of the photoresist pattern as a mask. In this process, wet etching using the PAN chemical liquid was used. Thereafter, the photoresist pattern is removed, whereby the gate electrode 2, the gate interconnect line 13, and the gate terminal 113 are formed on the upper main surface of the substrate 1, as shown in FIGS. 16 and 20. The third semiconductor layer 6a to be formed in a subsequent step is shown in phantom lines in FIG. 16.

Next, an insulation film which becomes the gate insulation film 3 is formed on the entire upper main surface of the substrate 1 so as to cover the gate electrode 2.

In the second embodiment, a CVD method was used to form a SiN film and a SiO film in the order named, thereby forming the insulation film. The silicon oxide film, which contains oxygen (O) atoms, is capable of suppressing influence resulting from the diffusion (emission) of O atoms from the first oxide semiconductor film into the insulation film when the first oxide semiconductor film is formed on the insulation film in a subsequent step. On the other hand, the SiO film is poor in barrier properties (blocking properties) against impurity elements exerting influence on TFT properties such as $H_2O$, $H_2$, Na, and K. For this reason, the SiN film excellent in barrier properties was provided under the SiO film in the second embodiment. More specifically, the insulation film was a laminated film comprised of the SiN film having a thickness of 400 nm and the SiO film having a thickness of 50 nm. The insulation film formed in this process functions as the gate insulation film 3 in the TFT portion.

Next, the first oxide semiconductor film which is the material of the first semiconductor layer 4 is formed on the gate insulation film 3. In the second embodiment, an oxide (e.g., InGaZnO) containing In, Ga, and Zn was used for the first oxide semiconductor film. More specifically, an InGaZnO film having a thickness of 50 nm was formed by a sputtering method using an InGaZnO target [$In_2O_3.Ga_2O_3.(ZnO)_2$] having an In:Ga:Zn:O atomic composition ratio of 1:1:1:4.

Figure 21:
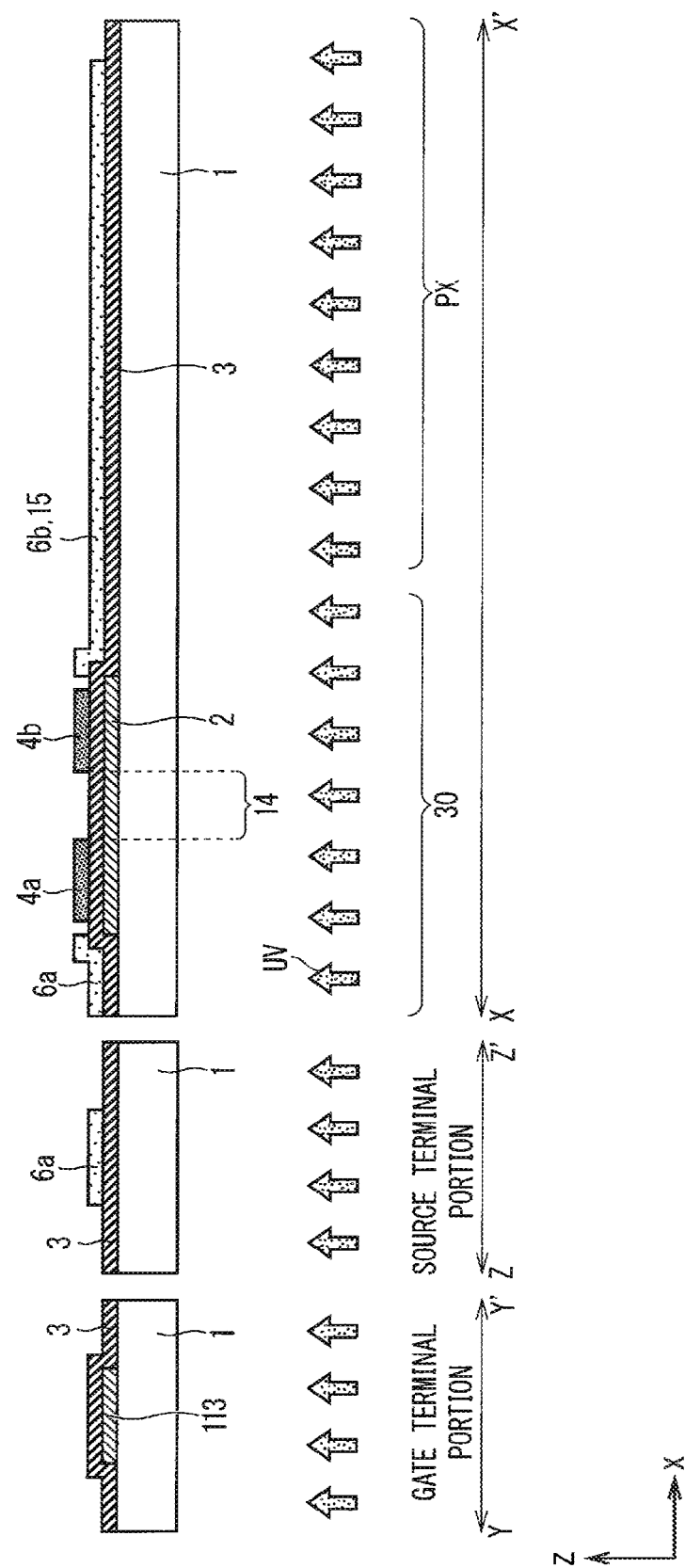
FIG. 21 is a sectional view showing a step for manufacturing the pixel TFT according to the second embodiment.

Thereafter, a photoresist pattern is formed in the second photolithographic step. The first oxide semiconductor film is patterned by etching with the use of the photoresist pattern as a mask. In this process, wet etching using a solution containing oxalic acid was used. Thereafter, the photoresist pattern is removed, whereby the pair of first semiconductor layers 4a and 4b sandwiching the partial region 14 as seen in plan view are formed on the gate insulation film 3 lying on the gate electrode 2, as shown in FIG. 21. Concurrently with this, the pair of third semiconductor layers 6a and 6b separated from the pair of first semiconductor layers 4a and 4b and sandwiching the pair of first semiconductor layers 4a and 4b as seen in plan view are formed on the gate insulation film 3 lying on the gate electrode 2. The first semiconductor layers 4a and 4b are formed in a region overlapping the gate electrode 2 as seen in plan view.

Next, the conversion of the third semiconductor layers 6a and 6b into a conductor is selectively performed. This conversion decreases the electrical resistance of the third semiconductor layers 6a and 6b to increase the electrical conductivity thereof. An example of the method of conversion into a conductor in the case where an oxide semiconductor such as InGaZnO is used for the third semiconductor layers 6a and 6b as in the second embodiment includes a method which directly irradiates the body of the oxide semiconductor film with plasma such as $H_2$ plasma containing hydrogen (H), for example. This method adds H atoms serving as electron carriers into the oxide semiconductor film to deoxidize the oxide semiconductor (decrease O atoms), thereby increasing an electron carrier density. There is another method which irradiates the oxide semiconductor film with ultraviolet radiation (UV light) having an intensity peak at a wavelength of not greater than 400 nm to increase the electron carrier density in the film.

The method which irradiates the oxide semiconductor film with UV light is used in the second embodiment. Specifically, as shown in FIG. 21, the underside of the substrate 1 is irradiated with UV light after the first semiconductor layers 4a and 4b and the third semiconductor layers 6a and 6b which are separated from each other are formed on the gate insulation film 3 of the substrate 1. That is, the back surface opposite the main surface of the substrate 1 (the surface where the gate electrode 2, the gate insulation film 3, the first semiconductor layers 4a and 4b, and the third semiconductor layers 6a and 6b are not formed) is irradiated with UV light. In this case, the substrate 1 and the gate insulation film 3 allow the UV light to pass therethrough, and the gate electrode 2 made of Mo blocks the UV light. Thus, the third semiconductor layers 6a and 6b are selectively converted into a conductor by the irradiation with the UV light, but the first semiconductor layers 4a and 4b formed in the region where the UV light is blocked by the gate electrode 2 maintain the semiconductor properties obtained immediately after the deposition.

The third semiconductor layer 6a converted into a conductor functions as an interconnect line underlying the source interconnect line 12 and the source terminal 112 to be formed in a subsequent step. The third semiconductor layer 6b converted into a conductor functions as the pixel electrode 15. The oxide semiconductor film typified by InGaZnO generally has a permeability of not less than 70% to visible light in the range of 400 to 800 nm. The third semiconductor layer 6b converted into a conductor is preferably usable as a transmission type pixel electrode.

In the above description, the back surface of the substrate 1 is irradiated with UV light after the patterns of the first semiconductor layers 4a and 4b and the third semiconductor layers 6a and 6b are formed. However, the irradiation with UV light is not limited to this. The underside of the substrate 1 may be irradiated with UV light after the first oxide semiconductor film is deposited and before the pattern of the first semiconductor layer 4a and the like is formed, and thereafter the patterns of the first semiconductor layers 4a and 4b and the third semiconductor layers 6a and 6b may be formed in the second photolithographic step. In this case, the first semiconductor layers 4a and 4b formed in the region where the UV light is blocked by the gate electrode 2 also maintain the semiconductor properties obtained immediately after the deposition.

Figure 17:
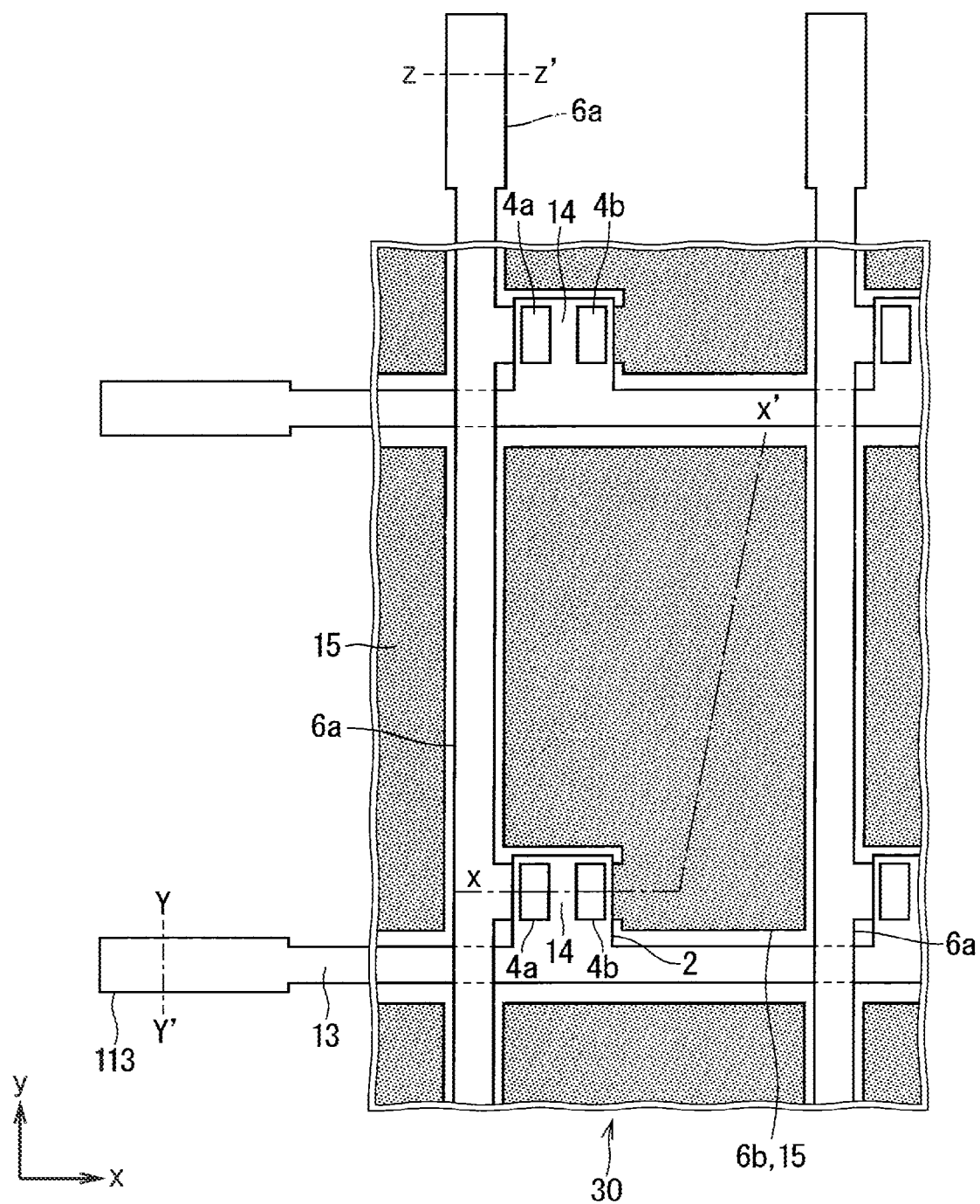
FIG. 17 is a plan view showing a step for manufacturing the pixel TFT according to the second embodiment.
Figure 22:
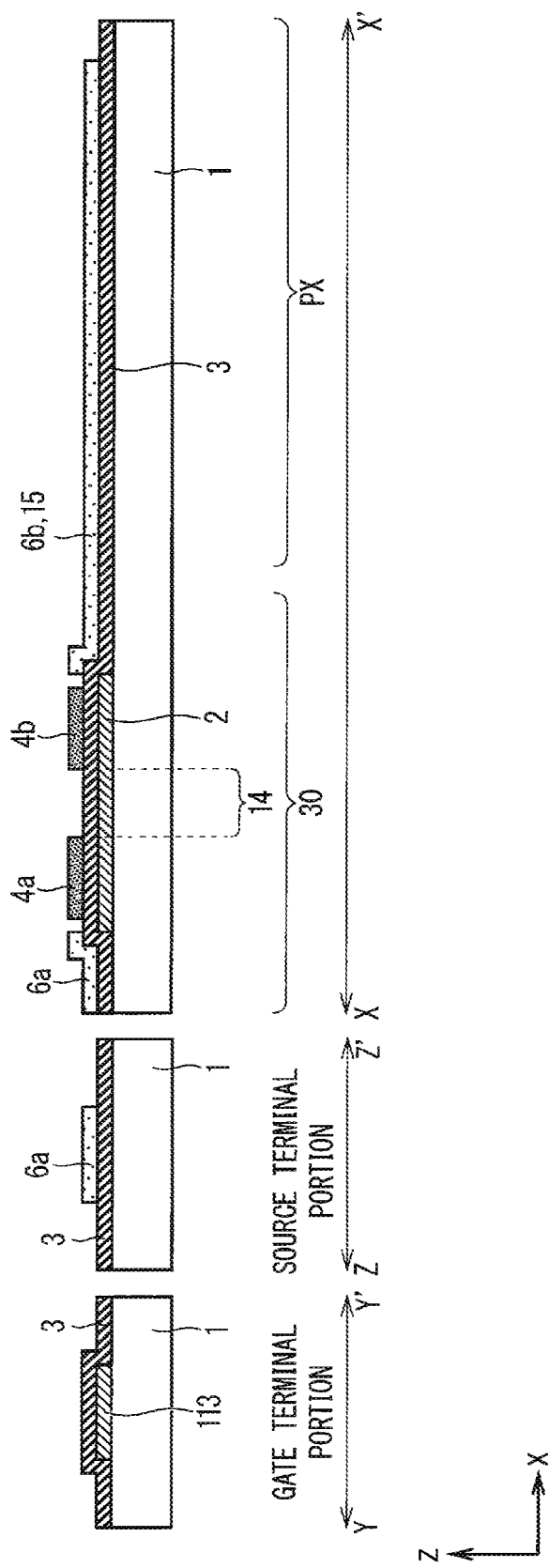
FIG. 22 is a sectional view showing a step for manufacturing the pixel TFT according to the second embodiment.

The aforementioned process forms the first semiconductor layers 4a and 4b, the third semiconductor layer 6a converted into a conductor, and the pixel electrode 15 including the third semiconductor layer 6b converted into a conductor on the gate insulation film 3 lying on the upper main surface of the substrate 1 of the TFT substrate 100, as shown in FIGS. 17 and 22. The partial region 14 of the gate insulation film 3 is exposed between the pair of first semiconductor layers 4a and 4b. The partial region 14 is formed in a region overlapping the gate electrode 2 as seen in plan view, for example.

Next, the second conductive film which is the material of the source electrode 16, the drain electrode 17, and the like is deposited in the same manner as the first conductive film. In the second embodiment, a Mo film having a thickness of 200 nm was formed as the second conductive film by a sputtering method using Ar gas.

Figure 18:
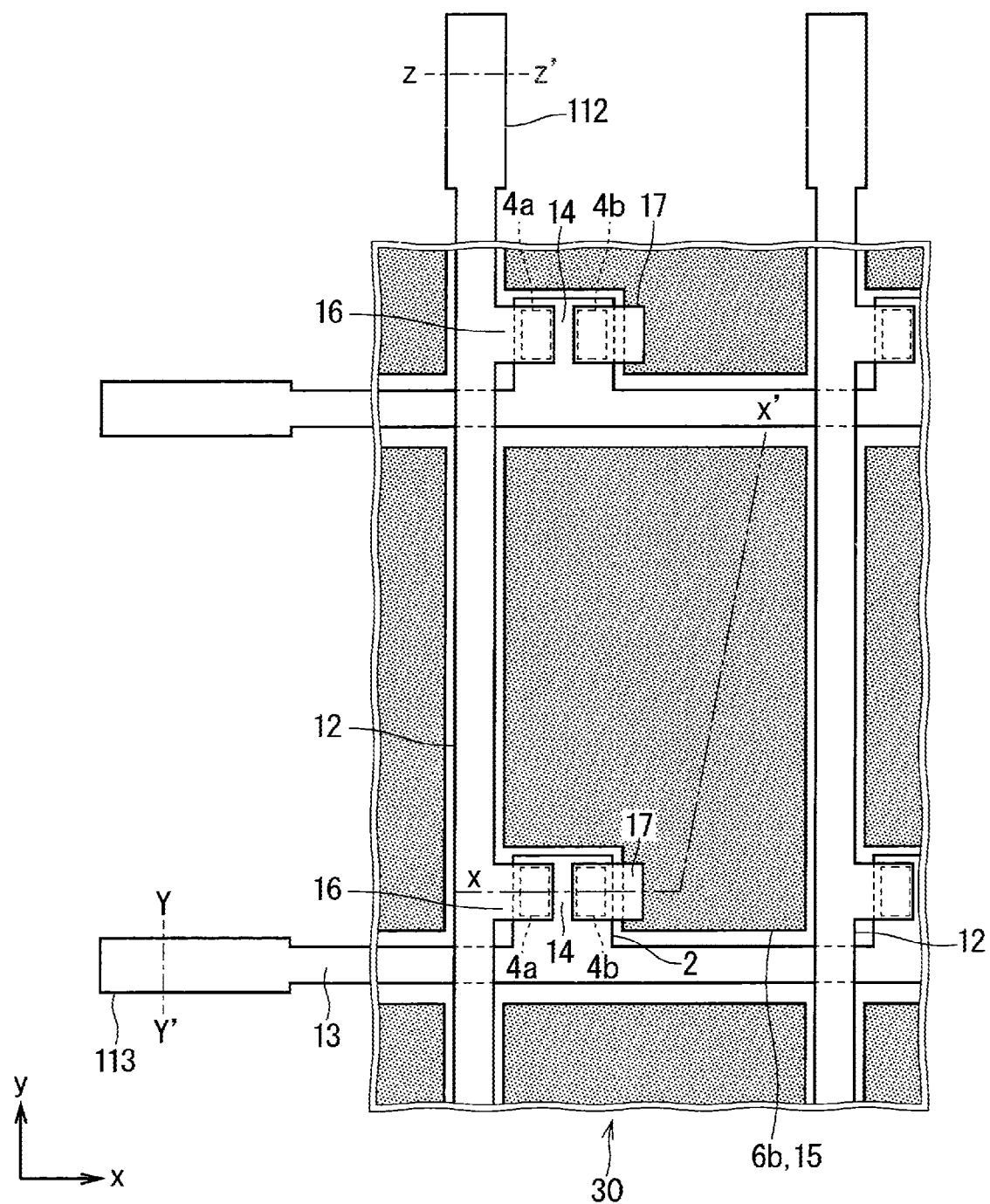
FIG. 18 is a plan view showing a step for manufacturing the pixel TFT according to the second embodiment.
Figure 23:
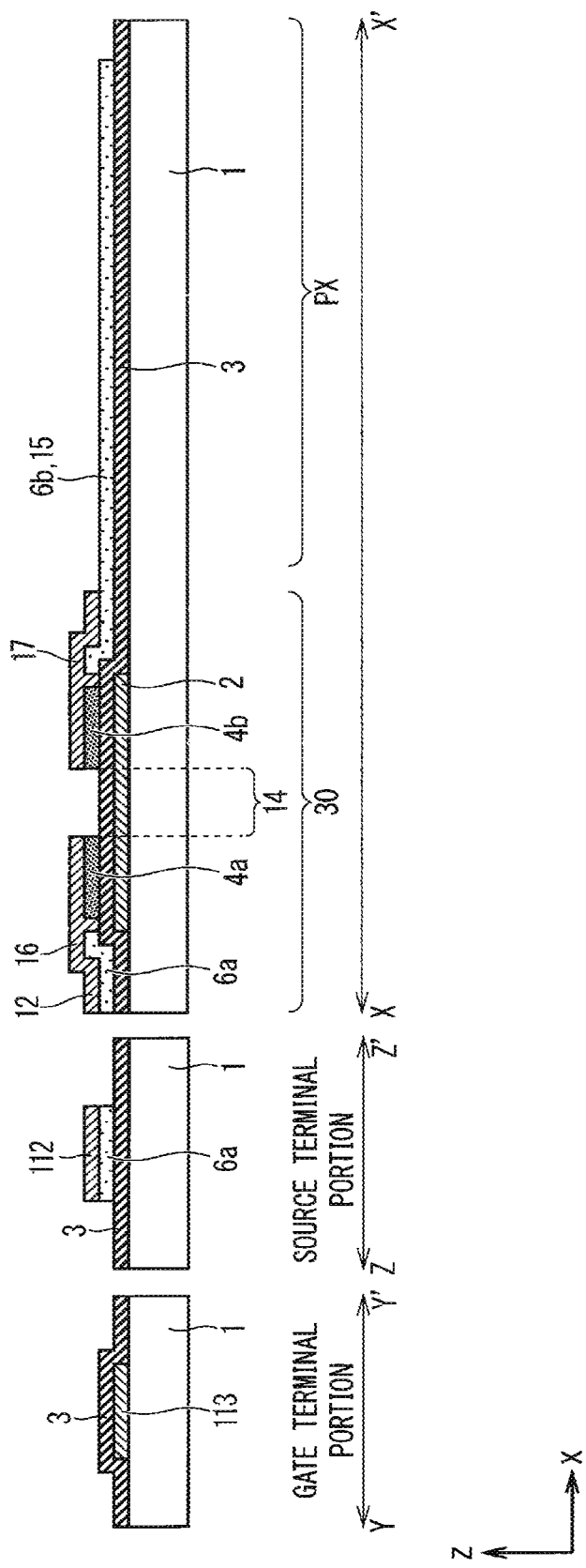
FIG. 23 is a sectional view showing a step for manufacturing the pixel TFT according to the second embodiment.

Thereafter, a photoresist pattern is formed in the third photolithographic step. The second conductive film is patterned by etching with the use of the photoresist pattern as a mask. In this process, wet etching using the PAN chemical liquid was used. Thereafter, the photoresist pattern is removed, whereby the source electrode 16 is formed on at least part of the first semiconductor layer 4a and at least part of the third semiconductor layer 6a, and the drain electrode 17 is formed on at least part of the first semiconductor layer 4b and at least part of the third semiconductor layer 6b, as shown in FIGS. 18 and 23. Concurrently with this, the source interconnect line 12 electrically connected to the source electrode 16 and the source terminal 112 are formed on the third semiconductor layer 6a.

The source electrode 16 is provided so as to branch off from the source interconnect line 12 and to be continuous with the source interconnect line 12, and the source terminal 112 is provided in an end portion of the source interconnect line 12. In the second embodiment, the third semiconductor layer 6a converted into a conductor extends from under the source electrode 16 to under the source terminal 112 except in a region overlapping the gate interconnect line 13.

The partial region 14 of the gate insulation film 3 is exposed between the source electrode 16 and the drain electrode 17. The partial region 14 is formed in the region overlapping the gate electrode 2 as seen in plan view, as in the configuration of FIG. 2. That is, the region of the gate insulation film 3 which lies between the source electrode 16 and the drain electrode 17 becomes the partial region 14.

The source electrode 16 is formed so as to overlie the first semiconductor layer 4a, and the drain electrode 17 is formed so as to overlie the first semiconductor layer 4b. In this case, the first semiconductor layers 4a and 4b may have the same shape as the source and drain electrodes 16 and 17 as seen in plan view or may have regions protruding from the source and drain electrodes 16 and 17.

Next, an insulation film which is the material of the interlayer insulation film 18 is formed on the entire upper main surface of the substrate 1 including the source electrode 16 and the drain electrode 17. In the second embodiment, a CVD method was used to deposit a SiO film having a thickness of 150 nm and a SiN film having a thickness of 50 nm in the order named, thereby forming the insulation film.

Thereafter, a photoresist pattern is formed in the fourth photolithographic step. The SiO film and the SiN film are patterned by etching with the use of the photoresist pattern as a mask. In this process, dry etching using a gas prepared by adding oxygen ($O_2$) to sulfur hexafluoride ($SF_6$) was used.

Figure 19:
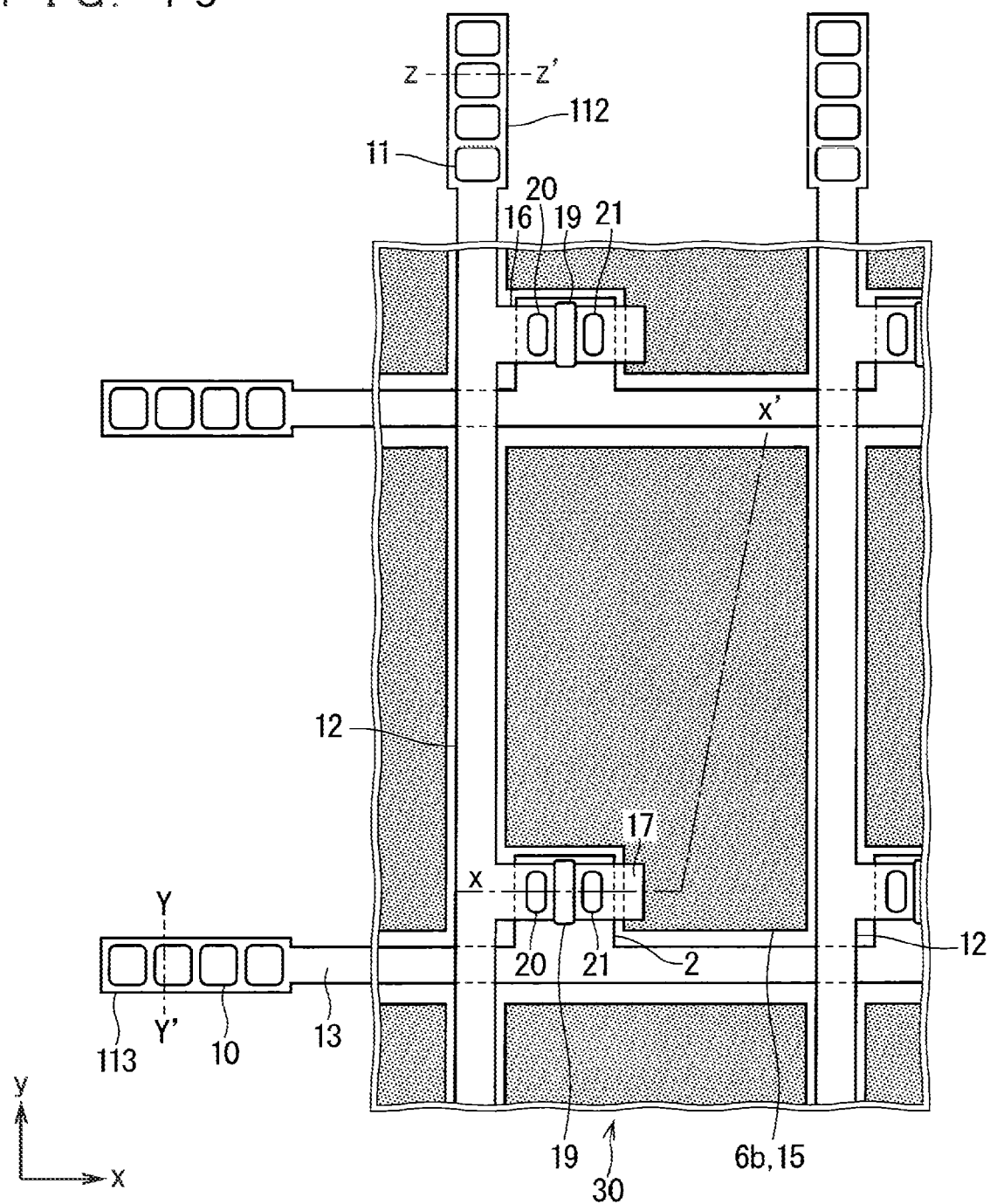
FIG. 19 is a plan view showing a step for manufacturing the pixel TFT according to the second embodiment.
Figure 24:
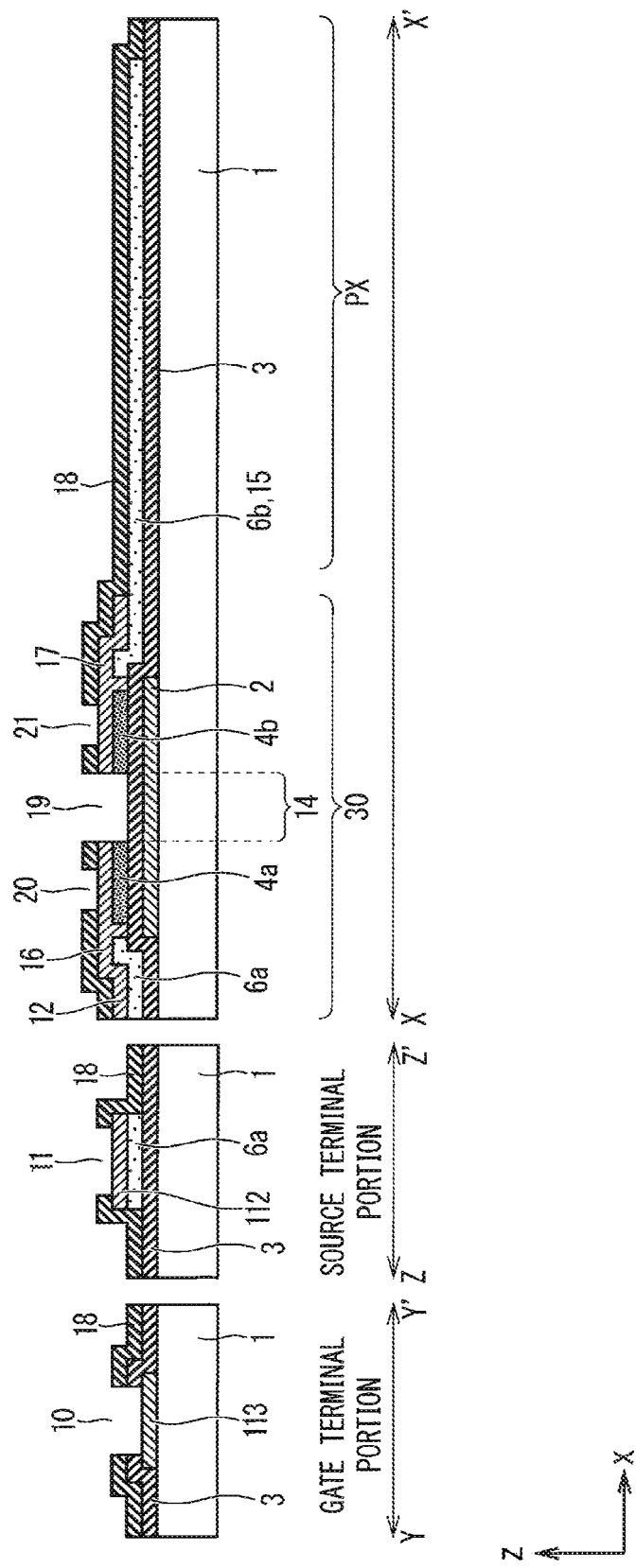
FIG. 24 is a sectional view showing a step for manufacturing the pixel TFT according to the second embodiment.

Thereafter, the photoresist pattern is removed, whereby the channel opening portion 19 which exposes the partial region 14 of the gate insulation film 3, the source electrode contact hole 20 which exposes part of the source electrode 16, the drain electrode contact hole 21 which exposes part of the drain electrode 17, the gate terminal contact hole 10 which exposes part of the gate terminal 113, and the source terminal contact hole 11 which exposes part of the source terminal 112 are formed in the insulation film, as shown in FIGS. 19 and 24. Thus, the interlayer insulation film 18 is formed.

Next, the second oxide semiconductor film is deposited on the entire upper main surface of the substrate 1 so as to cover the channel opening portion 19, the source electrode contact hole 20, the drain electrode contact hole 21, the gate terminal contact hole 10, and the source terminal contact hole 11. In the second embodiment, an oxide (e.g., InGaZnO) containing In, Ga, and Zn was used for the second oxide semiconductor film. More specifically, an InGaZnO film having a thickness of 50 nm was formed by a sputtering method using an InGaZnO target [$In_2O_3 \cdot Ga_2O_3 \cdot (ZnO)_2$] having an In:Ga:Zn:O atomic composition ratio of 1:1:1:4.

Thereafter, a photoresist pattern is formed in the fifth photolithographic step. The second oxide semiconductor film is patterned by etching with the use of the photoresist pattern as a mask. In this process, wet etching using a solution containing oxalic acid was used. Thereafter, the photoresist pattern is removed, whereby the second semiconductor layer 5 which is in contact with part of the source electrode 16 and the aforementioned part of the drain electrode 17 and which is in contact with the partial region 14 and the pair of first semiconductor layers 4a and 4b through the channel opening portion 19 is formed on the interlayer insulation film 18, as shown in FIGS. 14 and 15. Concurrently with this, the counter electrode 115 including the fourth semiconductor layer 7 is formed on the third semiconductor layer 6b, with the interlayer insulation film 18 between the counter electrode 115 and the third semiconductor layer 6b. Also concurrently with these, the gate terminal pad 213 including the fifth semiconductor layer 8 and the source terminal pad 212 including the sixth semiconductor layer 9 are formed.

The fourth semiconductor layer 7 of the counter electrode 115, the fifth semiconductor layer 8 of the gate terminal pad 213, and the sixth semiconductor layer 9 of the source terminal pad 212 are made of the same second oxide semiconductor material as the second semiconductor layer 5, and serve as the same layer as the second semiconductor layer 5.

The fourth to sixth semiconductor layers 7 to 9 should be formed as semiconductor layers selectively subjected to the conversion into a conductor. This conversion decreases the electrical resistance of the fourth to sixth semiconductor layers 7 to 9 so that the electrical conductivity thereof is higher than that of the second semiconductor layer 5.

It is, however, difficult to form the fourth to sixth semiconductor layers 7 to 9 with the use of the aforementioned method of irradiating the underside of the substrate 1 with UV light. This is because the pixel electrode 15 is formed under the counter electrode 115, and the gate terminal 113 and the source terminal 112 which are made of metal (Mo) films are formed respectively under the gate terminal pad 213 and the source terminal pad, whereby the UV light coming from the back surface side of the substrate 1 is blocked.

For this reason, the fourth to sixth semiconductor layers 7 to 9 were formed in process steps to be described below in the second embodiment.

Figure 25:
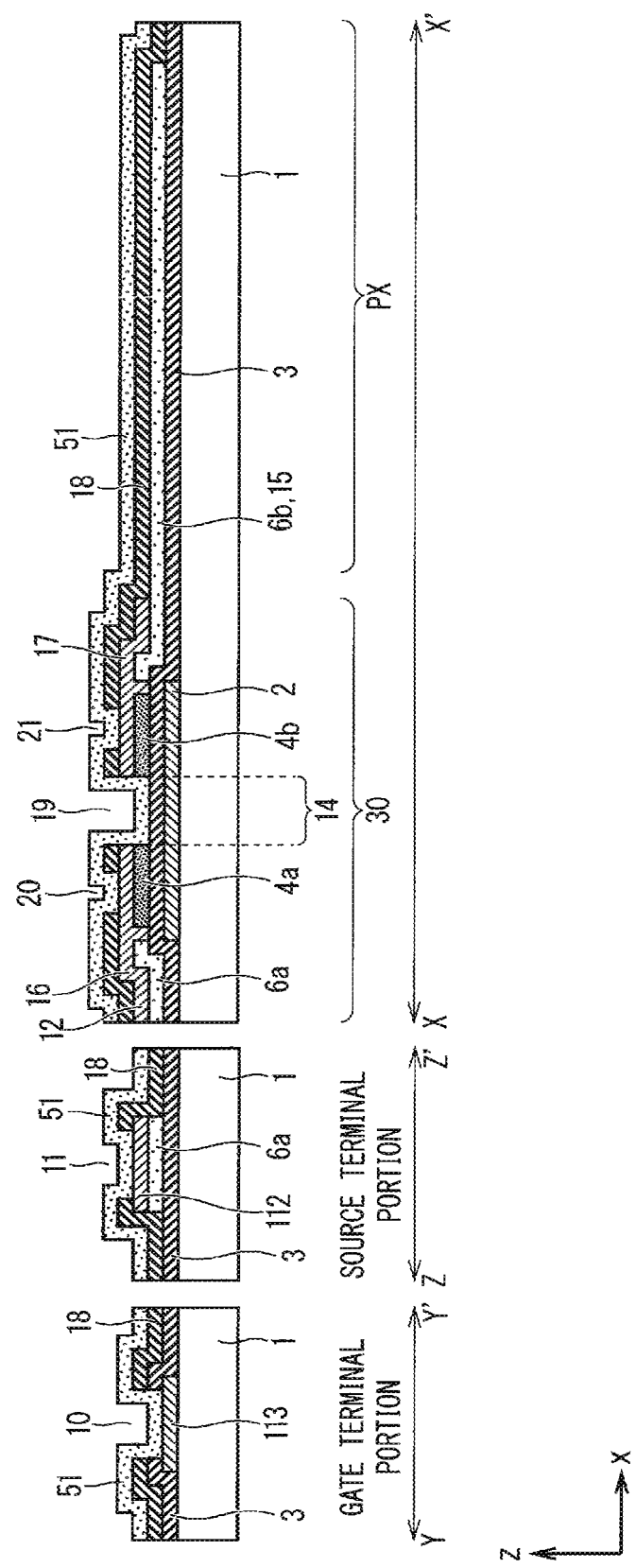
FIG. 25 is a sectional view showing a step for manufacturing the pixel TFT according to the second embodiment.

First, as shown in FIG. 25, a second oxide semiconductor film 51 is deposited on the entire upper main surface of the substrate 1 so as to cover the channel opening portion 19, the source electrode contact hole 20, the drain electrode contact hole 21, the gate terminal contact hole 10, and the source terminal contact hole 11. In this step, the sputtering method is used as mentioned above to deposit an InGaZnO film having a thickness of 50 nm, for example, as the second oxide semiconductor film 51.

Figure 26:
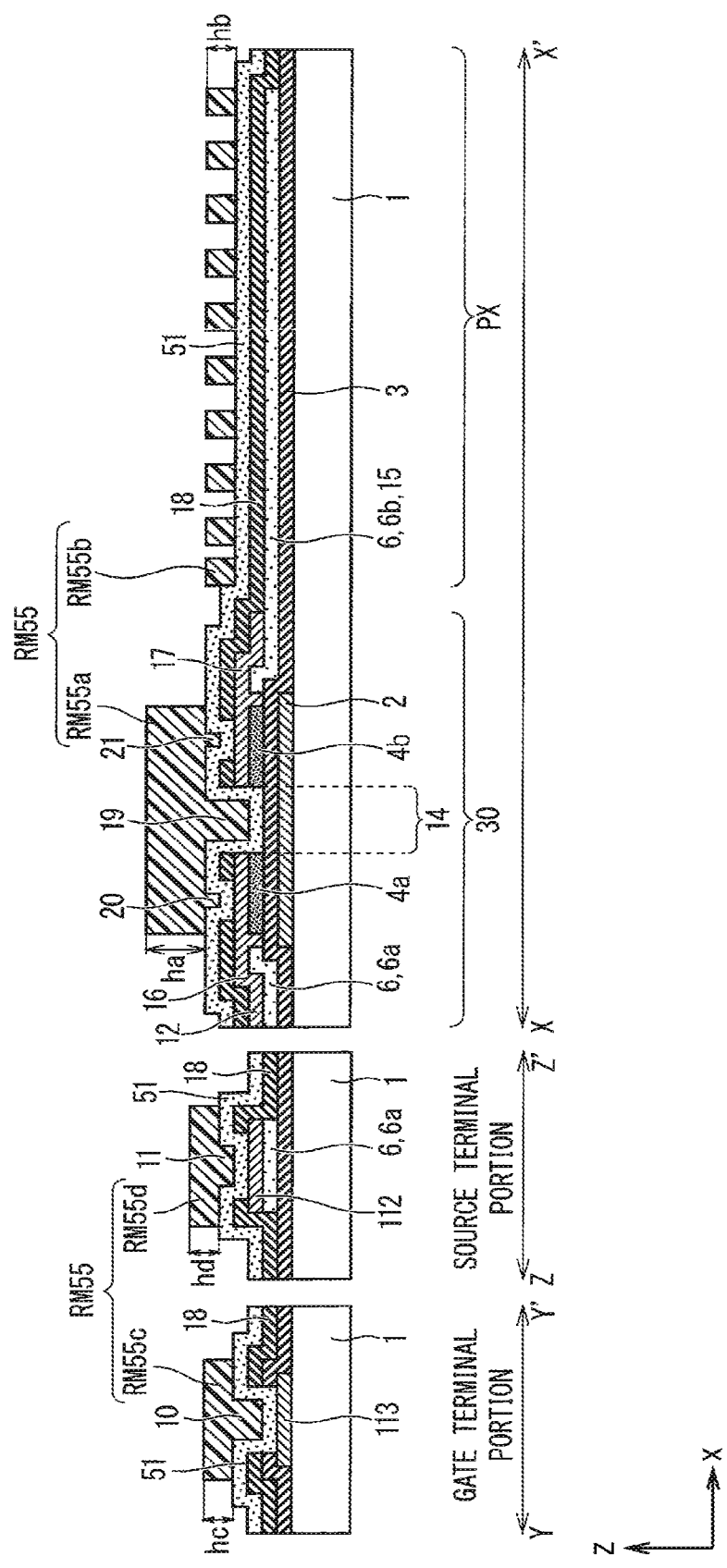
FIG. 26 is a sectional view showing a step for manufacturing the pixel TFT according to the second embodiment.

Next, as shown in FIG. 26, a photoresist formed on the second oxide semiconductor film 51 by a coating method is exposed to light and developed in the fifth photolithographic step, whereby a photoresist pattern RM55 is formed. For example, a photoresist material made of a positive photosensitive novolac resin is used for the photoresist to be exposed to light and developed.

The photoresist pattern RM55 includes a photoresist pattern RM55a for the formation of the second semiconductor layer 5 near the channel opening portion 19, a photoresist pattern RM55b for the formation of the counter electrode 115 (the fourth semiconductor layer 7) in the pixel region PX, a photoresist pattern RM55c for the formation of the gate terminal pad 213 (the fifth semiconductor layer 8) in the gate terminal portion, and a photoresist pattern RM55d for the formation of the source terminal pad 212 (the sixth semiconductor layer 9) in the source terminal portion. At this time, the thickness ha of the photoresist pattern RM55a is made greater than the thicknesses hb, hc, and hd of the respective photoresist patterns RM55b, RM55c, and RM55d. In the second embodiment, the photoresist patterns RM55a, RM55b, RM55c, and RM55d were formed so that the thickness ha was approximately 2.5 μm and the thicknesses hb, hc, and hd were approximately 1.0 μm.

Resist patterns having different thicknesses are formed, for example, by forming a photoresist having a desired maximum thickness (approximately 2.5 μm in the second embodiment) on the substrate 1 by a coating method and then controlling the amount of light for exposure in multiple steps during the exposure of the photoresist to light in a photolithographic step. Specifically, the process during the exposure of the photoresist to light is performed separately on three regions: a region to be irradiated directly with light for exposure, a region to be irradiated with attenuated light for exposure, and a region to be shielded against light for exposure.

When the process of developing the photoresist is thereafter performed, the photoresist is completely removed in the region irradiated directly with light for exposure, remains with the maximum thickness in the region shielded against light for exposure, and remains with a decreased thickness in the region irradiated with attenuated light for exposure. In the second embodiment, the photoresist pattern RM55a is formed in the region shielded against light for exposure, and the photoresist patterns RM55b, RM55c, and RM55d are formed in the region irradiated with attenuated light for exposure.

For controlling the amount of light for exposure in multiple steps in this manner, a known light exposure method using gray-tone or halftone photomasks, for example, may be used. A method used for these photomasks includes: forming a metal mask pattern into the shape of a slit to attenuate the light for exposure with the use of the diffraction phenomenon of light caused the shape of the slit or forming a mask pattern of a semi-transmissive film to attenuate the light for exposure with the use of the semi-transmissive film.

Figure 27:
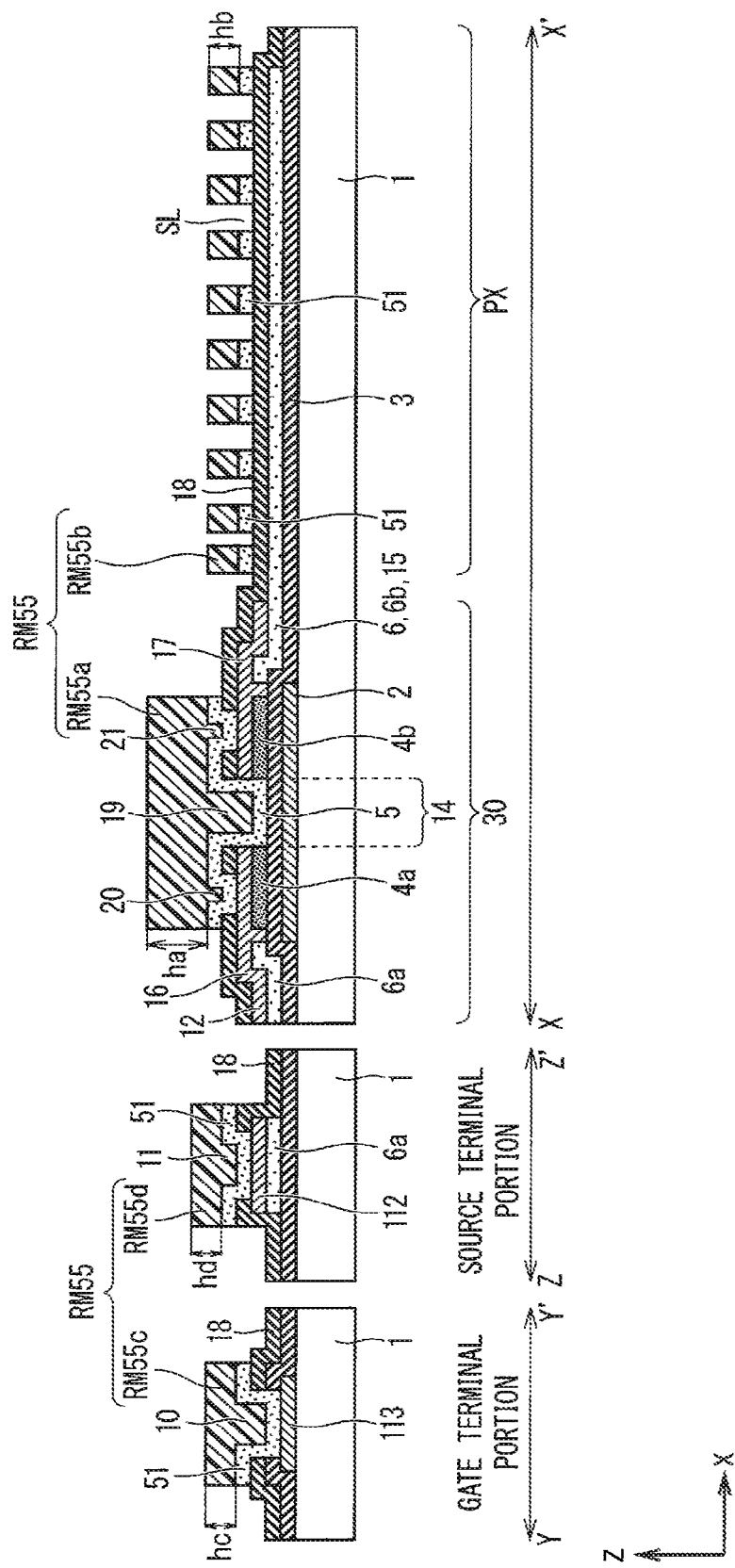
FIG. 27 is a sectional view showing a step for manufacturing the pixel TFT according to the second embodiment.

Next, as shown in FIG. 27, a patterning process is performed on the second oxide semiconductor film 51 by wet etching using a solution containing oxalic acid with the use of the photoresist patterns RM55a, RM55b, RM55c, and RM55d as an etching mask to form the second semiconductor layer 5. Concurrently with this, the pattern of the second oxide semiconductor film 51 becomes the same as the pattern of the fourth semiconductor layer 7 including the slit opening portions SL, the fifth semiconductor layer 8 of the source terminal portion, and the sixth semiconductor layer 9 of the source terminal portion.

Next, ashing is entirely performed on the photoresist pattern RM55 by directing oxygen (O₂) plasma OP onto the entire structure lying on the substrate 1. This removes the photoresist patterns RM55b, RM55c, and RM55d which are smaller in thickness, so that the patterned second oxide semiconductor film 51 is exposed. Concurrently with this, the thicker photoresist pattern RM55a is decreased in thickness, so that a photoresist pattern RM55e having a thickness he smaller than the thickness ha remains on the second semiconductor layer 5, as shown in FIG. 28.

Figure 28:
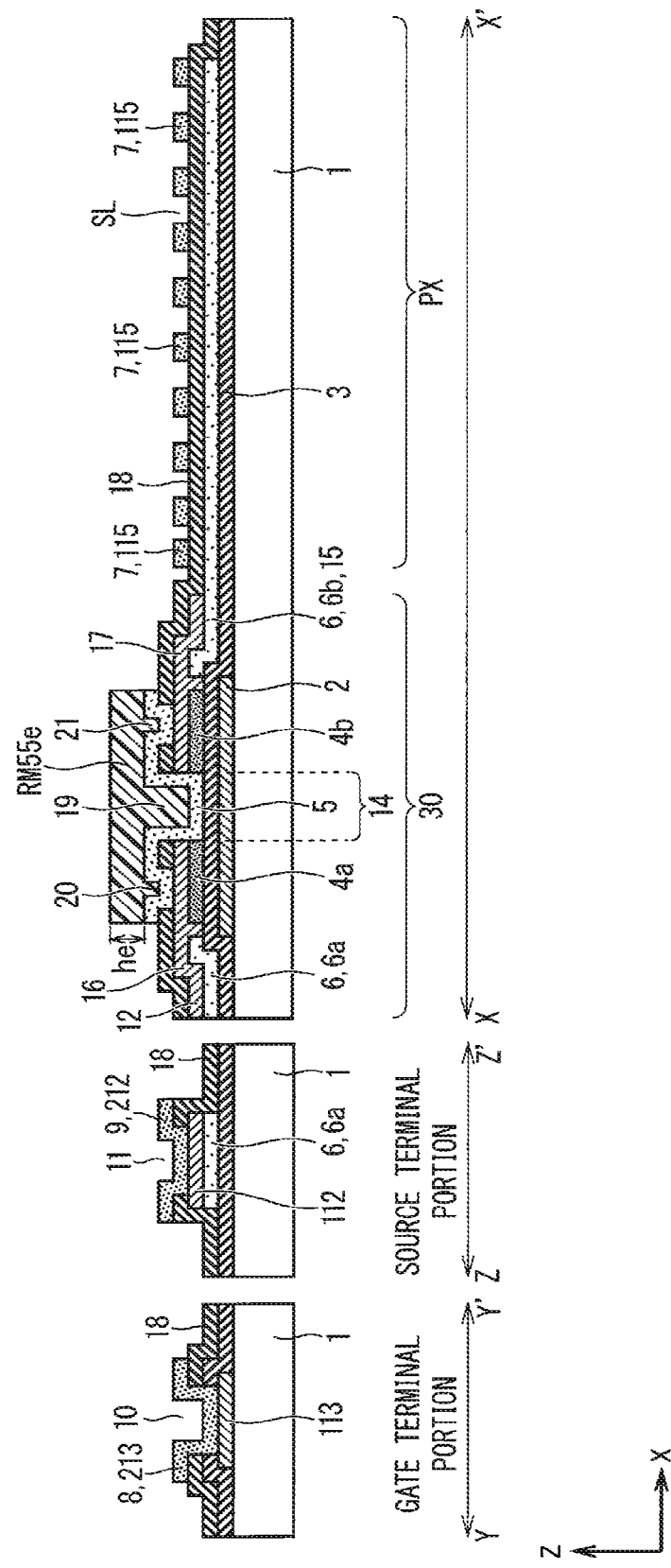
FIG. 28 is a sectional view showing a step for manufacturing the pixel TFT according to the second embodiment.

Thereafter, as shown in FIG. 28, UV light is directed onto the substrate 1 from above the substrate 1, i.e. from the upper main surface side of the substrate 1 (the surface side where the second semiconductor layer 5, the fourth semiconductor layer 7, the fifth semiconductor layer 8, and the sixth semiconductor layer 9 are formed), with the second semiconductor layer 5 covered with the photoresist pattern RM55e. In this case, the UV light is absorbed (blocked) by the photoresist pattern RM55e in a region covered with the photoresist pattern RM55e, and the UV light impinges upon a region not covered with the photoresist pattern RM55e. Thus, the second oxide semiconductor film 51 not covered with the photoresist pattern is selectively converted into a conductor by the irradiation with the UV light, so that the fourth semiconductor layer 7, the fifth semiconductor layer 8, and the sixth semiconductor layer 9 are formed. On the other hand, the second semiconductor layer 5 formed in the region blocked by the photoresist pattern RM55e maintains the semiconductor properties.

The fourth semiconductor layer 7 functions as the counter electrode 115 in the pixel region PX. The fifth semiconductor layer 8 functions as the gate terminal pad 213 for protecting the gate terminal 113. The sixth semiconductor layer 9 functions as the source terminal pad 212 for protecting the source terminal 112.

Thereafter, the photoresist pattern is removed, whereby the TFT substrate 100 for use in the FFS mode LCD according to the second embodiment is produced, as shown in FIGS. 14 and 15.

For assembly of a liquid crystal display panel, an alignment film and a spacer are initially formed on a surface of the TFT substrate 100 shown in FIGS. 14 and 15. The alignment film is a film for arranging liquid crystal, and is made of polyimide or the like. A separately produced counter substrate (not shown) including a color filter, an alignment film, and the like is affixed to the TFT substrate 100. At this time, a gap is formed between the TFT substrate and the counter substrate by the spacer. Liquid crystal is sealed in the gap. This provides a horizontal electric field driving FFS mode liquid crystal display panel. Finally, polarizing plates, a retardation film, a driving circuit, a backlight unit, and the like are disposed on the outside of the liquid crystal display panel, whereby a FFS mode LCD is completed.

In the aforementioned manufacturing steps, the driving TFTs 40 described in the first embodiment and the modifications thereof may be formed in the frame region 23 of the TFT substrate 100 at the same time that the pixel TFTs 30 of the second embodiment are formed in the display region 24 of the TFT substrate 100. In this case, the frame region of the LCD is narrowed, and the need for an external driving circuit board is eliminated. Thus, the FFS mode LCD is produced at low costs.

Gist of Second Embodiment

The TFT substrate 100 having the pixel TFTs 30 according to the second embodiment produces the effect of improving the TFT properties described in the first embodiment and the modifications thereof. Also, the second embodiment is capable of forming the pixel electrodes 15 concurrently with the step of forming the first semiconductor layers 4a and 4b, and is capable of forming the counter electrode 115 concurrently with the step of forming the second semiconductor layer 5. This reduces the number of photolithographic steps in the steps of manufacturing the TFT substrate 100 for the FFS mode having the pixel TFTs 30. As a result, the second embodiment is capable of simplifying the steps of manufacturing the TFT substrate including a high-mobility oxide semiconductor and is accordingly capable of simplifying the steps of manufacturing the LCD including the TFT substrate and having both a wider viewing angle and bright display properties to improve production efficiency of LCDs and to reduce the manufacturing costs thereof.

Also, the third semiconductor layer 6a converted into a conductor is provided under the source interconnect line 12. Thus, if one of the source interconnect line 12 and an interconnect line of the third semiconductor layer 6a is broken due to pattern failures, foreign substances, or the like, the break is covered by the other interconnect line. This prevents line defect failures of display resulting from a break in the source interconnect line 12.

Further, the second embodiment achieves the reduction in size of the scanning signal driving circuit 25 and the display signal driving circuit 26 when at least one of the scanning signal driving circuit 25 and the display signal driving circuit 26 is produced by forming the driving TFTs in the frame region 23 together with the pixel TFTs in the display region on the TFT substrate 100. This allows the frame region 23 in the TFT substrate 100 to accommodate the scanning signal driving circuit 25 and the display signal driving circuit 26 to reduce the costs of the scanning signal driving circuit 25 and the display signal driving circuit 26 and to narrow the frame region 23.

The provision of these driving circuits on the TFT substrate 100 eliminates the need for the conventional configuration in which driving ICs (Integrated Circuits) are mounted using FPCs (Flexible Printed Circuits). This allows the provision of LCDs having not only a quadrangular shape but also a variety of contour shapes such as circles and curved lines.

In the second embodiment, UV light is used to form the third to sixth semiconductor layers 6 to 9. Such a configuration eliminates the need to form a new mask pattern to reduce the photolithographic steps.

Materials for use in the embodiments and the modifications thereof according to the present invention are not limited to those described in the manufacturing steps. Other materials may be used in combination, as appropriate.

In the description of the aforementioned embodiments and modifications, an oxide semiconductor (In—Ga—Zn—O) containing In, Ga, and Zn is applied as the first oxide semiconductor film and the second oxide semiconductor film. However, the material of each semiconductor layer is not limited to this. For example, In—O, Ga—O, Zn—O, In—Zn—O, In—Ga—O, and Ga—Zn—O which are oxide semiconductors obtained by combining these metals as appropriate may be used as the material of each semiconductor layer. In addition to these oxide semiconductors, oxide semiconductors obtained by combining oxides of hafnium (Hf), tin (Sn), yttrium (Y), aluminum (Al), and the like as appropriate, for example, may be used as the material of each semiconductor layer.

The material of the semiconductor layers is not limited to oxide-based semiconductors. What is called III-V compound semiconductors, e.g. Ga—As, Ga—P, In—P, In—Sb, In—As, Al—N, Ga—N, and Al—Ga—N, which are obtained by combining a group 13 element selected from the group consisting of Al, Ga, and In and a group 15 element selected from the group consisting of nitrogen (N), phosphorus (P), arsenic (As), and antimony (Sb), or semiconductor materials obtained by adding other elements to these semiconductors may be used as the material of the semiconductor layers. These semiconductor materials are preferably used especially for the TFT substrate described in the first embodiment and the first and second modifications thereof.

Further, carbon nanotubes employing carbon (C) as a group 14 semiconductor element, graphene, and well-known Si and Ge, and semiconductor materials obtained by combining these elements may be used as the material of the semiconductor layers. These semiconductor materials are also preferably used especially for the TFT substrate described in the first embodiment and the first and second modifications thereof.

The effects of the present invention described in the aforementioned embodiments are produced even in the case where these semiconductor materials are used for the oxide layers. This is especially effective in the case where materials considered to be significantly influenced by process damages, such as oxide semiconductors, compound semiconductors or carbon-based semiconductors, are used.

Although the FFS mode liquid crystal display device has been described above, the present invention is not limited to this. The present invention is applicable to liquid crystal display devices of other modes such as a TN mode or a VA (Vertical Alignment) mode. In addition, the present invention is applicable to not only TFT substrates for liquid crystal display devices but also TFT substrates for self light emitting display devices including inorganic or organic electroluminescence (EL) materials in the pixel region.

The embodiments and modifications according to the present invention may be freely combined within the scope of the invention or the embodiments and modifications may be changed and dispensed with, as appropriate.

While the invention has been described in detail, the foregoing description is in all aspects illustrative and not restrictive. It is understood that numerous other modifications and variations can be devised without departing from the scope of the invention.

EXPLANATION OF REFERENCE SIGNS

1 Substrate
2 Gate electrode
3 Gate insulation film
4, 4a, 4b First semiconductor layers
5 Second semiconductor layer
6, 6a, 6b Third semiconductor layers
7 Fourth semiconductor layer
12 Source interconnect line
13 Gate interconnect line
14 Partial region
15 Pixel electrode
16 Source electrode
17 Drain electrode
18 Interlayer insulation film
19 Channel opening portion
25 Scanning signal driving circuit
26 Display signal driving circuit
30 Pixel TFT
40 Driving TFT
100 TFT substrate
115 Counter electrode

The invention claimed is:

1. A thin film transistor comprising:
a gate electrode provided on a substrate;
a first insulation film for covering the gate electrode;
a first semiconductor layer provided on the first insulation film lying on the gate electrode and adjacent to a partial region that is part of the first insulation film lying on the gate electrode as seen in plan view;
a source electrode and a drain electrode sandwiching the partial region between the source electrode and the drain electrode as seen in plan view, at least one of the source and drain electrodes being provided on the first insulation film and the first semiconductor layer;
a second insulation film provided on the source electrode and the drain electrode except part of the source electrode and part of the drain electrode and having an opening portion provided over the partial region; and
a second semiconductor layer provided on the second insulation film, the second semiconductor layer being in contact with the part of the source electrode and the part of the drain electrode, the second semiconductor layer being in contact with the partial region and the first semiconductor layer through the opening portion.

2. The thin film transistor according to claim 1, wherein the first semiconductor layer and the second semiconductor layer include an oxide semiconductor.

3. The thin film transistor according to claim 2, wherein the first semiconductor layer has a carrier density higher than that of the second semiconductor layer.

4. The thin film transistor according to claim 2, further comprising a third insulation film provided on the second semiconductor layer.

5. The thin film transistor according to claim 2, wherein the first semiconductor layer is provided so as to protrude from the source electrode toward the partial region as seen in plan view when the first semiconductor layer is provided under the source electrode; and
wherein the first semiconductor layer is provided so as to protrude from the drain electrode toward the partial region as seen in plan view when the first semiconductor layer is provided under the drain electrode.

6. A thin film transistor substrate comprising:
a thin film transistor as recited in claim 2;
the substrate;
a gate interconnect line and a source interconnect line intersecting each other on the substrate and connected to the thin film transistor;
a pixel electrode including a third semiconductor layer and provided in a region defined by the gate interconnect line and the source interconnect line, the pixel electrode being in contact with the drain electrode; and
a counter electrode including a fourth semiconductor layer and provided over the pixel electrode while being insulated from the pixel electrode,
wherein the third semiconductor layer of the pixel electrode serves as the same layer as the first semiconductor layer, and
wherein the fourth semiconductor layer of the counter electrode serves as the same layer as the second semiconductor layer.

7. The thin film transistor substrate according to claim 6, further comprising
a semiconductor layer serving as the same layer as the third semiconductor layer and provided under the source interconnect line.

8. The thin film transistor substrate according to claim 6, wherein
the counter electrode has a plurality of slit opening portions or a comb tooth shape.

9. A liquid crystal display device comprising:
a thin film transistor substrate according to claim 6; and
a counter substrate holding a liquid crystal layer between the thin film transistor substrate and the counter substrate.

10. The liquid crystal display device according to claim 9, further comprising
a driving circuit provided on the thin film transistor substrate and including another thin film transistor similar to the thin film transistor.

11. The thin film transistor according to claim 1, wherein the first semiconductor layer has a carrier density higher than that of the second semiconductor layer.

12. The thin film transistor according to claim 1, further comprising
a third insulation film provided on the second semiconductor layer.

13. The thin film transistor according to claim 1, wherein the first semiconductor layer is provided so as to protrude from the source electrode toward the partial region as seen in plan view when the first semiconductor layer is provided under the source electrode; and wherein the first semiconductor layer is provided so as to protrude from the drain electrode toward the partial region as seen in plan view when the first semiconductor layer is provided under the drain electrode.

14. A thin film transistor substrate comprising:

a thin film transistor as recited in claim 1;

the substrate;

a gate interconnect line and a source interconnect line intersecting each other on the substrate and connected to the thin film transistor;

a pixel electrode including a third semiconductor layer and provided in a region defined by the gate interconnect line and the source interconnect line, the pixel electrode being in contact with the drain electrode; and a counter electrode including a fourth semiconductor layer and provided over the pixel electrode while being insulated from the pixel electrode, wherein the third semiconductor layer of the pixel electrode serves as the same layer as the first semiconductor layer, and wherein the fourth semiconductor layer of the counter electrode serves as the same layer as the second semiconductor layer.

15. The thin film transistor substrate according to claim 14, further comprising a semiconductor layer serving as the same layer as the third semiconductor layer and provided under the source interconnect line.

16. The thin film transistor substrate according to claim 14, wherein the counter electrode has a plurality of slit opening portions or a comb tooth shape.

17. A liquid crystal display device comprising:

a thin transistor substrate according to claim 14; and a counter substrate holding a liquid crystal layer between the thin film transistor substrate and the counter substrate.

18. The liquid crystal display device according to claim 17, further comprising a driving circuit provided on the thin film transistor substrate and including another thin film transistor similar to the thin film transistor.

* * * * *